(12) United States Patent
Tsuchiya et al.

(10) Patent No.: US 6,686,126 B2
(45) Date of Patent: Feb. 3, 2004

(54) DEVELOPING SOLUTION FOR PHOTOSENSITIVE LITHOGRAPHIC PRINTING PLATE, PLATE-MAKING METHOD OF LITHOGRAPHIC PRINTING PLATE, AND PHOTOSENSITIVE LITHOGRAPHIC PRINTING PLATE

(75) Inventors: Mitsumasa Tsuchiya, Shizuoka (JP); Hiroyuki Nagase, Shizuoka (JP); Shunichi Kondo, Shizuoka (JP); Kazuto Kunita, Shizuoka (JP)

(73) Assignee: Fuji Photo Film Co., Ltd., Ashigara (JP)

( * ) Notice: Subject to any disclaimer, the term of this patent is extended or adjusted under 35 U.S.C. 154(b) by 0 days.

(21) Appl. No.: 09/901,676

(22) Filed: Jul. 11, 2001

(65) Prior Publication Data

US 2002/0092436 A1 Jul. 18, 2002

(30) Foreign Application Priority Data

Jul. 14, 2000 (JP) .................................. P2000-214599
Sep. 12, 2000 (JP) .................................. P2000-276811

(51) Int. Cl.⁷ ................................................. G03C 7/30
(52) U.S. Cl. ....................................................... 430/302
(58) Field of Search ........................................ 430/302

(56) References Cited

U.S. PATENT DOCUMENTS

| | | | |
|---|---|---|---|
| 3,475,171 A | * 10/1969 | Alles | .......................... 430/331 |
| 3,586,504 A | 6/1971 | Coates | |
| 3,615,480 A | * 10/1971 | Lam | .......................... 430/331 |
| 4,098,712 A | 7/1978 | Ikeda | |
| 5,834,156 A | 11/1998 | Urasaki | |
| 6,100,016 A | 8/2000 | Denzinger | |
| 6,180,322 B1 | 1/2001 | Sakurai | |

FOREIGN PATENT DOCUMENTS

| | | | |
|---|---|---|---|
| EP | 0080042 | * | 6/1983 |
| EP | 0 602 736 A2 | | 12/1993 |
| EP | 0 820 840 A2 | | 7/1997 |
| EP | 0 924 570 A1 | | 12/1998 |
| EP | 0 949 540 A1 | | 4/1999 |
| EP | 0 953 880 A2 | | 4/1999 |
| EP | 1 035 435 A2 | | 3/2000 |
| EP | 1 048 982 A1 | | 4/2000 |
| EP | 1 070 990 A1 | | 7/2000 |
| EP | 1 091 251 A2 | | 10/2000 |
| GB | 1 591 988 | | 12/1977 |
| JP | 60-263147 A | | 12/1985 |
| WO | 87/04810 A1 | | 8/1987 |

\* cited by examiner

*Primary Examiner*—Hoa Van Le
(74) *Attorney, Agent, or Firm*—Burns, Doane, Swecker & Mathis, LLP

(57) ABSTRACT

A plate-making method of a lithographic printing plate is disclosed, which comprises the steps of exposure of a photo-sensitive lithographic printing plate having the acid value of a photosensitive layer of 1.0 meq/g or less with a laser beam, and then development with a developing solution having a pH value of 13.0 or less at a developing speed in an unexposed domain of 0.05 μm/s or more and at an osmotic speed of a developing solution in an exposed domain of 0.1 μm/s or less.

10 Claims, 2 Drawing Sheets

B: Photosensitive material in which the developing solution is easily immersed.

$t_B$: Time in which electrostatic capacity is changed.

A: Photosensitive material in which the developing solution is immersed with difficulty.

$T_a$: Time in which electrostatic capacity is changed.

The change of the film thickness is detected by the coherent (Coherent Wave o): Invention (Coherent Wave x): Conventional

DEVELOPING SOLUTION FOR PHOTOSENSITIVE LITHOGRAPHIC PRINTING PLATE, PLATE-MAKING METHOD OF LITHOGRAPHIC PRINTING PLATE, AND PHOTOSENSITIVE LITHOGRAPHIC PRINTING PLATE

FIELD OF THE INVENTION

The present invention relates to a novel developing solution for a photosensitive lithographic printing plate, a plate-making method of a lithographic printing plate, and a photosensitive lithographic printing plate. More specifically, the present invention relates to a developing solution optimal for a photopolymerizable lithographic printing plate which does not cause the reduction of developing properties with the lapse of time and repeated use, has good developing properties to a non-image domain (an unexposed domain) of a lithographic printing plate, prevents staining due to printing, gives less damage due to development to an image domain (an exposed domain), forms a stable image, does not cause printing troubles during printing such as blinding, and realizing high printing durability. The present invention further relates to a plate-making method of a lithographic printing plate and a photosensitive lithographic printing plate.

BACKGROUND OF THE INVENTION

The developing solutions for photopolymerizable lithographic printing plates conventionally widely used are divided broadly into the following a) to c), i.e., a) a non-aqueous developing solution mainly comprising an organic solvent, b) an aqueous developing solution mainly comprising an inorganic alkali, and c) an aqueous developing solution mainly comprising an organic base.

Of the above three developing solutions, developing solutions b) and c) are used these days from the environmental demands.

Describing these two developing solutions in detail, a silicate is contained in the inorganic alkali developing solution b) near pH 12 for carrying out hydrophilizing treatment on a support generally after development.

A silicate is an essential component for performing hydrophilizing treatment, i.e., for preventing staining of a non-image domain at printing.

For example, the developing solution having pH of 12 or higher as disclosed in JP-A-8-248643 (the term "JP-A" as used herein means an "unexamined published Japanese patent application") and the developing solution having pH of 12 or lower as disclosed in JP-A-11-65129 are known as developing solution b). However, the former developing solution having pH of 12 or higher is liable to dissolve the aluminum used generally as a support, in particular when an image domain comprises minute dots, the aluminum support just under the image domain is dissolved by a side-etching phenomenon to cause the separation of minute dots from the support (dot-skipping) at printing, which extremely deteriorates a press life (i.e., a printing durability).

Further, a developing solution having pH of 12 or lower is preferred in the point of the above-described press life and the prevention of printing staining, but as a result of continuing development processing for a long period of time, pH is liable to lower due to the effect of, e.g., the carbon dioxide gas in the air, and the silicate precipitates in a developing solution at this time and development processing becomes unstable.

As an example of a developing solution, developing solutions not containing a silicate are disclosed in JP-A-61-109052, West German Patent 1,984,605, JP-A-2000-81711 and JP-A-11-65126, but all of these developing solutions are not only more disadvantageous than those containing a silicate in the point of the printing staining but the press life is also deteriorated.

On the other hand, as the organic base developing solution c), those containing an organic amine such as an ethanolamine and an alcohol-based organic solvent such as a benzyl alcohol as an auxiliary developing agent are known. The pH value of these developing solutions is certainly low, such as about 10, and so they are difficult to be affected by carbon dioxide gas and processing stability is good, but they are not only disadvantageous in the point of hydrophilization to a support, but also their osmotic power to an image domain is too high, thus there arises a problem that minute dots are separated from the support at development, i.e., an image-forming property is deteriorated.

That is, with respect to a photopolymerizable lithographic printing plate, a suitable developing solution is not found yet from the points of image-forming property, resistance to printing staining, printing durability and processing stability.

With respect to the composition of a developing solution, it is known that whether silicate is contained or not, whether pH is high or low, and the difference between an inorganic alkali and an organic alkali greatly influence a development phenomenon but conventional combinations cannot solve the above problems.

Further, when development processing of a photopolymerizable lithographic printing plate is continued for a long period of time, insoluble substance is accumulated, agglomerated, precipitated and becomes development scum, which becomes a main cause of making development processing unstable.

The components of such development scum have not been clearly known until now but it was found from the analysis that much of the scum was insoluble components of a developing solution contained in a photosensitive layer.

As the insoluble components, e.g., various kinds of colorants which are added to a photosensitive layer for the purpose of discriminating an exposed domain from an unexposed domain can be exemplified. In the case of phopolymerizable lithographic printing plates, for the purpose of avoiding desensitization due to radical supplement and desensitization due to unnecessary interaction (energy transfer and electron transfer) with an initiator system (an initiator alone, or combination of an initiator with a sensitizing dye), a pigment is used as the colorant which is not molecularly dispersed in a photosensitive layer but is dispersed as an aggregate with maintaining a crystalline state. However, these pigment are substantially insoluble in a developing solution, therefore they are at first temporarily dispersed in a developing solution in a development step for removing an unexposed area but when development processing is continued for a long period of time, they are accumulated, agglomerated, precipitated and come to development scum.

On the other hand, various photopolymerization initiators (radical generating agents) are used in a photopolymerizable lithographic printing plate to cope with laser light sources which are making progress in recent years. Of these initiators, titanocene-based initiators are known as the initiators which have photosensitivity in the wavelength of laser light source and excellent in stability and sensitivity. However, titanocene-based initiators are organic metals and insoluble in a developing solution similar to the above pigments, and temporarily dispersed in a developing solution but when development processing is continued for a long period of time, they are accumulated, agglomerated, precipitated and also come to development scum.

With respect to the processing stability, it is very important to solve not only the problem of the precipitation of silicate with the reduction of pH but also the problem of development scum.

That is, as the developing solution for a photopolymerizable lithographic printing plate, a developing solution which satisfies the above-described image-forming property, the compatibility of printing staining resistance with printing durability, and processing stability is desired.

Further, since conventionally broadly used negative type photosensitive lithographic printing plates are comprising a hydrophilized aluminum plate having provided thereon a diazo resin, the use of an organic solvent in a developing solution cannot be helped, hence there are fears of the disposal of developing waste solution and the influence to the environment.

Further, an orthoquinonediazide compound is used in combination with a novolak resin in a photosensitive layer of a positive type photosensitive lithographic printing plate, and an alkaline aqueous solution of silicate which can dissolve a novolak resin is used in a developing solution. However, the pH value capable of dissolving a novolak resin is 13 or so, and if a developing solution having such high pH is attached to the skin or a mucous membrane, it irritate the skin hard, hence sufficient care should be taken to handle it.

On the other hand, a photosensitive lithographic printing plate comprising an aluminum support having a photosensitive layer of a photopolymerizable photosensitive lithographic printing plate is also used and aqueous solutions of silicate, phosphate, carbonate and hydroxide of alkali metal and an organic amine compound are proposed as the developing solution.

For example, a developing solution having pH of 12 or more and containing silicic acid alkali salt and an amphoteric surfactant is disclosed in JP-A-8-248643, and a developing solution containing silicic acid alkali silicate defined by $SiO_2/M_2O$ (M represents an alkali metal) having pH of 12 or less is disclosed in JP-A-11-65129.

The former has a problem that an image domain is liable to be damaged by development due to high pH value of the developing solution in addition to a problem of handling, and the latter has a problem that silicate gels and is insolubilized with the slight reduction of the pH value of the developing solution during use.

As developing solutions not containing silicic acid alkali salt, a developing solution comprising an alkali reagent, a complexing agent, an anionic surfactant, an emulsifying agent, an n-alkanoic acid, etc., is disclosed in JP-A-61-109052, and a developing solution comprising an alkali agent, a complexing agent, an anionic surfactant, an amyl alcohol, N-alkoxyamines, etc., is disclosed in West German Patent 1,984,605, but the damage to an image domain is great due to their high pH values and organic solvents contained, and sufficient printing properties, such as press life, cannot be obtained.

As a developing solution having relatively low pH (12 or less) and not containing silicic acid alkali, a developing solution comprising an aqueous solution of potassium hydroxide containing an anionic surfactant is disclosed in JP-A-2000-81711, and a developing solution comprising an aqueous solution of alkali metal carbonate having pH of from 8.5 to 11.5 is disclosed in JP-A-11-65126.

However, since these developing solutions having relatively low pH are fundamentally poor in dissolving power of photopolymerizable photosensitive layer, development does not progress sufficiently with a printing plate after the lapse of time, as a result the problem of residual film arises. For resolving these problems, it is necessary to contrive to increase the acid value of the high polymer binder in a photosensitive layer to thereby improve developing property, or use a monomer having an acid radical in combination. However, when such a binder having high acid value is used, printing troubles during printing, e.g., a trouble that ink comes to not adhere during printing (blinding), are liable to occur.

SUMMARY OF THE INVENTION

Accordingly, the objects of the present invention are to provide a developing solution for a photosensitive lithographic printing plate by which the above-described weak points of conventional techniques can be overcome, an image-forming property is not damaged, staining resistance during printing can be compatible with printing durability, the above-described insoluble compounds in a developing solution can be dissolved or dispersed stably for long time, and processing stability can be improved, and provide a plate-making method of a lithographic printing plate and a photosensitive lithographic printing plate.

A further object of the present invention is to provide a plate-making method of a lithographic printing plate using an alkali developing solution having comparatively low pH which is preferable in environment and safety, in which plate-making method can produce a lithographic printing plate having a preferred non-image domain stably having good developing property without staining due to printing, can give less damage by development to an image domain, can form a stable image without printing troubles during printing such as blinding, and can realize high printing durability.

As a result of eager investigation by the present inventors, the above objects of the present invention have been achieved by the following means.

That is, the embodiments of the present invention are as follows.

(1) A plate-making method of a lithographic printing plate which comprises the steps of exposure of a photosensitive lithographic printing plate having the acid value of a photosensitive layer of 1.0 meq/g or less with a laser beam, and then development with a developing solution having a pH of 13.0 or less at a developing speed in an unexposed domain of 0.05 μm/s or more and at an osmotic speed of a developing solution in an exposed domain of 0.1 μm/s or less.

(2) A plate-making method of a lithographic printing plate which comprises the steps of exposure of a photosensitive lithographic printing plate having the acid value of a photosensitive layer of 1.0 meq/g or less with a laser beam, and then development with a developing solution having a pH value of 13.0 or less so as to dissolve the photosensitive layer in order from the surface without swelling and peeling of the photosensitive layer.

(3) A developing solution for a photosensitive lithographic printing plate which is a non-silicate-based developing solution and contains an inorganic alkali agent and a nonionic compound represented by the following formula (I):

wherein A represents a hydrophobic organic group having 1.5 or more of logP of A—H, and W represents a hydrophilic organic group having less than 1.0 of logP of W—H.

(4) The developing solution for a photosensitive lithographic printing plate as described in the above item (3), which contains a chelating agent to a divalent metal.

(5) The developing solution for a photosensitive lithographic printing plate as described in the above item (3), which has a pH of from 100.0 to 12.5 and electrical conductance of from 3 to 30 mS/cm.

(6) The developing solution for a photosensitive lithographic printing plate as described in the above item (3), which contains a carbonic acid or a carbonate.

(7) The plate-making method of a lithographic printing plate as described in the above item (1) or (2), wherein the photosensitive lithographic printing plate is a photopolymerizable lithographic printing plate having on a support a photopolymerizable photosensitive layer containing the following i) and ii) as essential components:

i) a compound having an addition polymerizable ethylenically unsaturated bond, and ii) a photopolymerization initiator.

(8) The plate-making method of a lithographic printing plate as described in the above item (7), wherein the photopolymerizable photosensitive layer contains a titanocene-based initiator or a colorant (e.g., a pigment).

(9) The plate-making method of a lithographic printing plate as described in the above item (7), wherein the support is an anodized aluminum support containing an organic compound having a phosphorus-containing atomic group on the surface of the support.

(10) A photosensitive lithographic printing plate comprising a photopolymerizable photosensitive layer, wherein the photosensitive layer contains a compound having an acid radical having a pKa of 9 or less and the acid value of the photosensitive layer is from 0.20 to 0.60 meq/g.

(11) A plate-making method of a lithographic printing plate which comprises the steps of image exposure of a photosensitive lithographic printing plate comprising an aluminum support having an anodized film on the surface having provided thereon a photopolymerizable photosensitive layer containing a compound having an addition polymerizable ethylenically unsaturated double bond, a high polymer soluble or swelling in an alkaline aqueous solution, and a photopolymerization initiator with a laser beam, and then development with a developing solution comprising an alkaline aqueous solution containing at least one of a nonionic aromatic ether-based activator represented by the following formula (I-A) and a nonionic aromatic ether-based activator represented by the following formula (I-B):

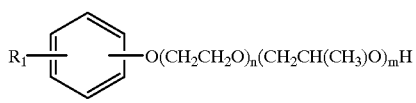

(I-A)

(I-B)

wherein $R_1$ and $R_2$ each represents H or an alkyl group having from 1 to 100 carbon atoms, and n and m each represents an integer of from 0 to 100.

(12) A plate-making method of a lithographic printing plate which comprises the steps of image exposure of a photosensitive lithographic printing plate comprising an aluminum support having provided thereon a photopolymerizable photosensitive layer containing a compound having an ethylenically unsaturated double bond, a photopolymerization initiator and a high polymer binder, and then development with a developing solution containing an inorganic alkali agent and a nonionic surfactant having a polyoxyalkylene ether group, having a pH of from 10.0 to 12.5, and an electrical conductance of from 3 to 30 mS/cm.

As a result of eager investigations of developing solution compositions, resistance to printing staining could be compatible with printing durability without impairing an image-forming property, the above-described insoluble compounds in a developing solution could be dissolved or dispersed stably for long time, and processing stability could be improved by using a developing solution comprising special components.

At present, the special developing solution is thought to be the developing solution composition which satisfies the following requisites.

First, to be capable of extraordinarily well functioning to image-forming property (the developing property at an unexposed domain is high, the osmotic property of a developing solution to an exposed domain is low, and dissolution behavior of a photosensitive layer is non-swelling and a photosensitive layer is dissolved in order from the surface).

Secondly, to be capable of excluding the unexposed domain of a photosensitive layer completely and reclaiming the support surface as a hydrophilic layer generating no printing staining.

Thirdly, for stably dispersing or solubilizing the above-described compounds insoluble in a developing solution, a nonionic compound represented by formula (I) having a hydrophilic site to be dispersed and stabilized with a hydrophobic site interacting with these insoluble compounds must be contained.

Fourthly, the concentration of salt must be low to prevent salting out and the reduction of a developing speed (the developing solution must be non-silicate-based and the pH must be low as compared with conventionally used alkali developing solutions).

Fifthly, to contain a chelating agent to remove a divalent metal such as a Ca ion contained in water which is an unstabilizing factor at development processing.

Of these, with respect to the first and second requisites, the characteristics of photosensitive layer components are also important factors. The photosensitive layer of a photopolymerizable lithographic printing plate is not restricted particularly, but until the present it is known that having lower photosensitive layer acid value than conventional acid value is thought to be important to obtain a synergistic effect with the developing solution according to the present invention.

The present inventors have found that, by combining an alkali solution having relatively low pH with a nonionic surfactant having special structure, and adjusting the salt concentration in the developing solution, the dissolving speed of the unexposed domain of a photopolymerizable photosensitive layer increases and, contrary to this, the osmosis of the developing solution is controlled in the area crosslinked by polymerization of the exposed domain, thus the present invention has been accomplished.

Therefore, a printing plate comprising an unexposed domain having no printing staining and an exposed domain having high press life (i.e., high printing durability) can be obtained stably according to the present invention.

BRIEF DESCRIPTION OF THE ACCOMPANYING DRAWINGS

In these figures, the Numerals denote the following members, respectively.

1. Support
2. Recoding Layer
3. Electrode
4. Developing solution
5. Photosensitive Layer
6. Photosensitive Material

DETAILED DESCRIPTION OF THE INVENTION

A developing solution for a photosensitive lithographic printing plate, a plate-making method and a photosensitive lithographic printing plate according to the present invention are described in detail below.

In the first place, developing behavior is described in detail below.

Developing Speed

The developing speed used in the present invention is defined as follows: A lithographic printing plate precursor obtained in Example 1 described later is immersed as it is without exposure in various kinds of developing solutions at 28° C., and the time until the photosensitive layer is removed and the support appears is measured. The developing speed to the film thickness of the photosensitive layer is calculated. The higher the developing speed, the greater and the better is the developing property.

Developing speed of the unexposed domain=film thickness of photosensitive layer ($\mu$m)/development completed time (s).

Osmotic Speed of Developing Solution

The osmotic speed of a developing solution used in the present invention is defined as follows: A lithographic printing plate precursor obtained in Example 1 described later is subjected to exposure, then immersed in various kinds of developing solutions at 28° C., and the change of electrostatic capacity is measured. By measuring the time when the change of electrostatic capacity begins, the time required for the developing solution to osmose and come into contact with the support can be found (when the changing point does not appear clearly, it is estimated by the time required for the electrostatic capacity to reach 100 nF). The osmotic speed of a developing solution in the direction of the photosensitive layer thickness is computed from the above-found time. The smaller the speed, the lower and the better is the osmotic property. An apparatus for measuring the osmotic speed of a developing solution and a graph for measuring are shown in FIGS. 1 and 2 respectively.

Osmotic speed of a developing solution in the exposed domain=photosensitive layer thickness ($\mu$m)/time when the change of electrostatic capacity begins (s).

Figure 1:
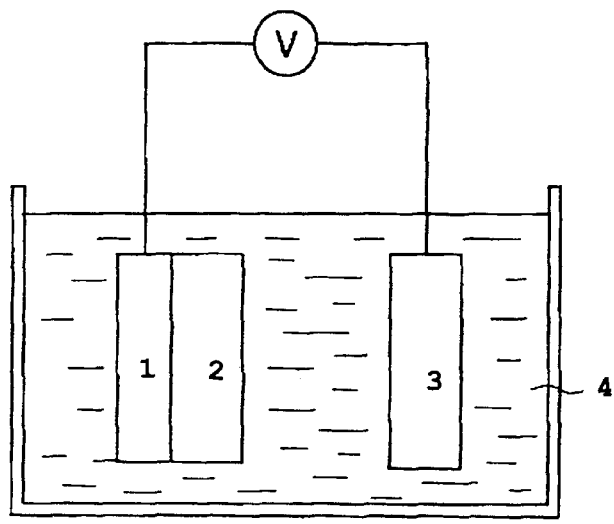
FIG. 1 is a schematic diagram of an apparatus for measuring the osmotic speed of a developing solution.
Figure 2:
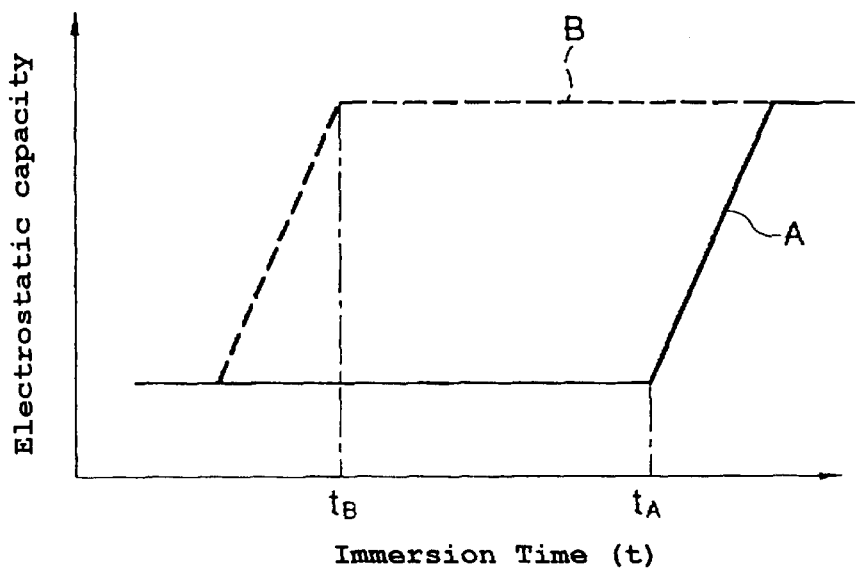
FIG. 2 is a graph for measuring the osmotic speed of a developing solution.

An apparatus for measuring the osmotic speed of a developing solution and a graph for measuring are shown in FIGS. 1 and 2, respectively.

Dissolution and Swelling of Photosensitive Layer

The dissolution and swelling of a photosensitive layer is defined as follows: A lithographic printing plate precursor obtained in Example 1 described later is immersed as it is without exposure in various kinds of developing solutions at 30° C., and the dissolution behavior of the photosensitive layer is measured by a DRM coherent wave-measuring apparatus.

When development behavior is non-swelling development starting from the surface of a photosensitive layer, the photosensitive layer thickness becomes gradually thin to the developing time and a clear coherent wave corresponding to the thickness can be obtained. Contrary to this, in the case of swelling dissolution (or dissolution not depending upon film), a clear coherent wave cannot be obtained, since the layer thickness changes according to the osmosis of a developing solution.

It is preferred that a clear coherent wave can be obtained, and evaluation is performed by the presence or absence of a coherent wave.

Figure 3:
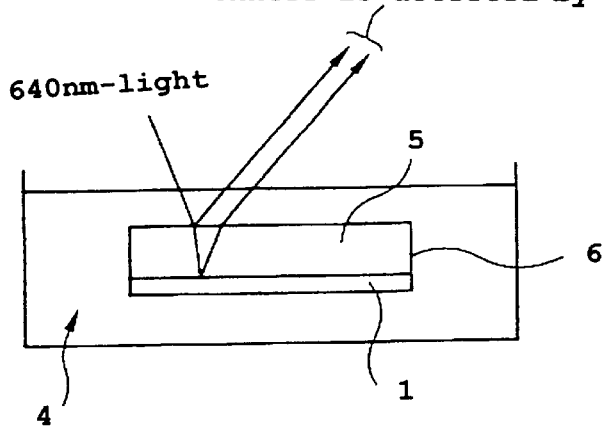
FIG. 3 is a schematic diagram of a DRM coherent wave-measuring apparatus for measuring the dissolution and swelling of a photosensitive layer.
Figure 4:
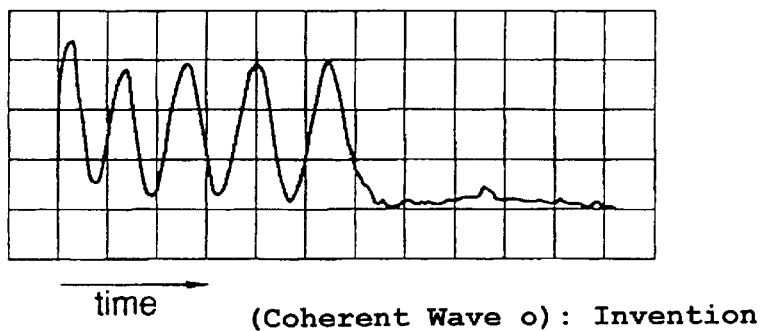
FIG. 4 is a graph for measuring the dissolution and swelling of a photosensitive layer.
Figure 4:
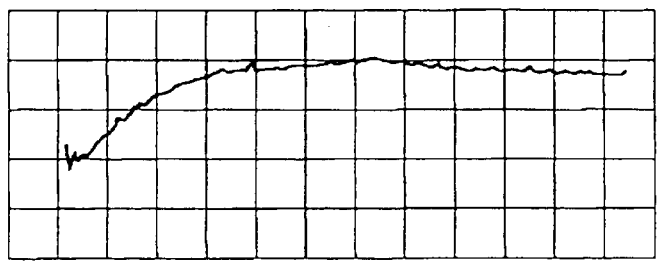

A DRM coherent wave-measuring apparatus for measuring the dissolution and swelling of a photosensitive layer and a graph for measuring are shown in FIGS. 3 and 4 respectively.

The components of the developing solution according to the present invention are described in detail below.

Nonionic Compound Represented by Formula (I)

$$A—W \qquad (I)$$

wherein A represents a hydrophobic organic group having 1.5 or more of logP of A—H, and W represents a hydrophilic organic group having less than 1.0 of logP of W—H.

logP is generally used as a hydrophobic parameter as described in C. Hansch, A. Leo, *Substituent Constants for Correlation Analysis in Chemistry and Biology,* John Wiley & Sons, Inc. (1979), and is defined as the logarithm of equilibrium concentration ratio P computed from the ratio divided to each layer of two layer system of octanol/water of the objective molecules (A—H and W—H).

Here each group of A and W in formula (I) is used as a specified characteristic, and logP value is computed from well-known data based on the method described in A. K. Ghose, et al., *J. Comput. Chem.,* 9, 80 (1988) as to A—H and A—W, i.e., these are the structures of organic groups A and W to each of which a hydrogen atom is bonded for convenience' sake.

Specifically, organic groups A and W are different from each other in structure, and each represents a monovalent organic residue which satisfies the above logP. More preferably, A and W, which may be the same or different, each represents a hydrogen atom, a halogen atom, a hydrocarbon group which may have a substituent and may contain an unsaturated bond, a heterocyclic group, a hydroxyl group, a substituted oxy group, a mercapto group, a substituted thio group, an amino group, a substituted amino group, a substituted carbonyl group, a carboxylate group, a sulfo group, a sulfonato group, a substituted sulfinyl group, a substituted sulfonyl group, a phosphono group, a substituted phosphono group, a phosphonato group, a substituted phosphonato group, a cyano group, or a nitro group.

As the above hydrocarbon group which may have a substituent and may contain an unsaturated bond, an alkyl group, a substituted alkyl group, an aryl group, a substituted aryl group, an alkenyl group, a substituted alkenyl group, an alkynyl group and a substituted alkynyl group can be exemplified.

As the alkyl groups, a straight chain, branched or cyclic alkyl group having from 1 to 20 carbon atoms can be exemplified, and specific examples thereof include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these groups, a straight chain alkyl group having from 1 to 12 carbon atoms, a branched alkyl group having from 3 to 12 carbon atoms, and a cyclic alkyl group having from 5 to 10 carbon atoms are more preferred.

The substituted alkyl group is made by bonding a substituent with an alkylene group, and monovalent nonmetallic atomic groups exclusive of a hydrogen atom are used as the substituents. Preferred examples of the substituents of the substituted alkyl group include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and a conjugate base group of it (hereinafter referred to as a carboxylato group), an alkoxycarbonyl group, an aryloxy-carbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkyl-sulfonyl group, an arylsulfonyl group, a sulfo group (—SO$_3$H) and a conjugate base group of it (hereinafter referred to as a sulfonato group), an alkoxysulfonyl group, an aryloxy-sulfonyl group, a sulfinamoyl group, an N-alkylsulfinamoyl group, an N, N-dialkylsulfinamoyl group, an N-arylsulfinamoyl group, an N,N-diarylsulfinamoyl group, an N-alkyl-N-aryl-sulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-aryl-sulfamoyl group, an N-acylsulfamoyl group and a conjugate base group of it, an N-alkylsulfonylsulfamoyl group (—SO$_2$NHSO$_2$(alkyl)) and a conjugate base group of it, an N-arylsulfonylsulfamoyl group (—SO$_2$NHSO$_2$(allyl)) and a conjugate base group of it, an N-alkylsulfonylcarbamoyl group (—CONHSO$_2$(alkyl)) and a conjugate base group of it, an N-arylsulfonylcarbamoyl group (—CONHSO$_2$(allyl)) and a conjugate base group of it, an alkoxysilyl group (—Si(O-alkyl)$_3$), an aryloxysilyl group (—Si(O-allyl)$_3$), a hydroxysilyl group (—Si(OH)$_3$) and a conjugate base group of it, a phosphono group (—PO$_3$H$_2$) and a conjugate base group of it (hereinafter referred to as a phosphonato group), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkyl-phosphono group (—PO$_3$H(alkyl)) and a conjugate base group of it (hereinafter referred to as an alkylphosphonato group), a monoarylphosphono group (—PO$_3$H(aryl)) and a conjugate base group of it (hereinafter referred to as an arylphosphonato group), a phosphonooxy group (—OPO$_3$H$_2$) and a conjugate base group of it (hereinafter referred to as a phosphonatooxy group), a dialkylphosphonooxy group (—OPO$_3$(alkyl)$_2$), a diarylphosphonooxy group (—OPO$_3$(aryl)$_2$), an alkylaryl-phosphonooxy group (—OPO$_3$(alkyl)(aryl)), a monoalkyl-phosphonooxy group (—OPO$_3$H(alkyl)) and a conjugate base group of it (hereinafter referred to as an alkylphosphonatooxy group), a monoarylphosphonooxy group (—OPO$_3$H(aryl)) and a conjugate base group of it (hereinafter referred to as an arylphosphonatooxy group), a cyano group, a nitro group, an aryl group, an alkenyl group, and an alkynyl group.

As the specific examples of the alkyl groups in the substituents of the substituted alkyl groups, the above-described alkyl groups can be exemplified. As the specific examples of the aryl groups in the substituents of the substituted alkyl groups, a phenyl group, a biphenyl group, a naphthyl group, a tolyl group, a xylyl group, a mesityl group, a cumenyl group, a fluorophenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenyl carbamoylphenyl group, a phenyl group, a nitrophenyl group, a cyanophenyl group, a sulfophenyl group, a sulfonatophenyl group, a phosphonophenyl group and a phosphonatophenyl group can be exemplified. As the examples of the alkenyl groups in the substituents of the substituted alkyl groups, a vinyl group, a 1-propenyl group, a 1-butenyl group, a cinnamyl group, and a 2-chloro-1-ethenyl group can be exemplified, and as the examples of the alkynyl groups in the substituents of the substituted alkyl groups, an ethynyl group, a 1-propynyl group, a 1-butynyl group, a trimethylsilylethynyl group and a phenylethynyl group can be exemplified.

As R$^4$ in the acyl group (R$^4$CO—) in the substituents of the substituted alkyl groups, a hydrogen atom and the above-described alkyl groups, aryl groups, alkenyl groups and alkynyl groups can be exemplified. On the other hand, as the alkylene group in the substituted alkyl group, the alkylene groups obtained by removing any one hydrogen atom on the above-described alkyl groups having from 1 to 20 carbon atoms to make divalent organic residues can be exemplified, preferably a straight chain alkylene group having from 1 to 12 carbon atoms, a branched alkylene group having from 3 to 12 carbon atoms, and a cyclic alkylene group having from 5 to 10 carbon atoms are exemplified. Specific examples of the preferred substituted alkyl groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, a methoxycarbonylmethyl group, a methoxycarbonylbutyl group, an ethoxycarbonylmethyl group, a butoxycarbonylmethyl group, an allyloxycarbonylmethyl group, a benzyloxycarbonylmethyl group, a methoxycarbonylphenylmethyl group, a trichloromethylcarbonylmethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfopropyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group,

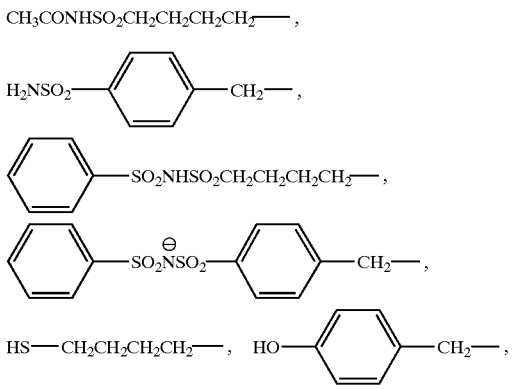

a phosphonobutyl group, a phosphonatohexyl group, a diethyl-phosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylethyl group, a 2-propynyl group, a 2-butynyl group, and a 3-butynyl group.

As the aryl groups, a condensed ring formed by 1 to 3 benzene rings and a condensed ring formed by a benzene ring and a 5-membered unsaturated ring can be exemplified, and specific examples include a phenyl group, a naphthyl group, an anthryl group, a phenanthryl group, an indenyl group, an acenabutenyl group, and a fluorenyl group. Of these, a phenyl group and a naphthyl group are more preferred.

The substituted aryl group is that obtained by bonding a substituent to an aryl group, and those having a monovalent non-metallic atomic groups exclusive of a hydrogen atom on the ring-forming carbon atoms of the above-described aryl groups as the substituent are used. As preferred examples of the substituents, the above-described alkyl groups, substituted alkyl groups, and those described above as the examples of the substituents in the substituted alkyl groups can be exemplified. Preferred specific examples of these substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, a phenylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

As the examples of the alkenyl groups, the groups described above can be used. The substituted alkenyl group is that in which a substituent is bonded to the alkenyl group by replacing with the hydrogen atom in the alkenyl group, and as the substituents of the substituted alkenyl group, the substituents exemplified above in the substituted alkyl group can be used.

As the alkenyl group, the above-described alkenyl groups can be used. As the preferred examples of the substituted alkenyl groups, the following compounds can be exemplified.

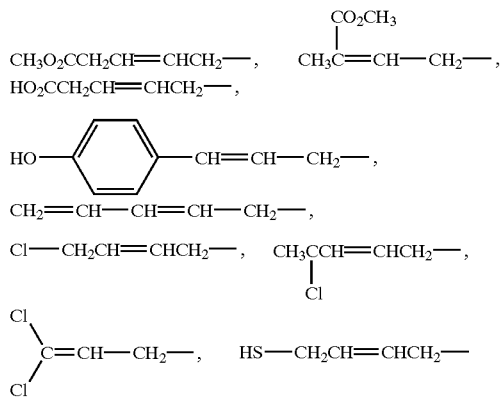

As the examples of the alkynyl groups, the groups described above can be used. The substituted alkynyl group is that in which a substituent is bonded to the alkynyl group by replacing with the hydrogen atom in the alkynyl group, and as the substituents of the substituted alkynyl group, the substituents exemplified above in the substituted alkyl group can be used. As the alkynyl group, the above-described alkynyl groups can be used.

The heterocyclic group is a monovalent group (a substituted heterocyclic group) obtained by removing one hydrogen atom from a heterocyclic ring, further removing one hydrogen atom from this monovalent group, and bonding the substituent in the above-described substituted alkyl group thereto. The preferred examples of the heterocyclic groups are shown below.

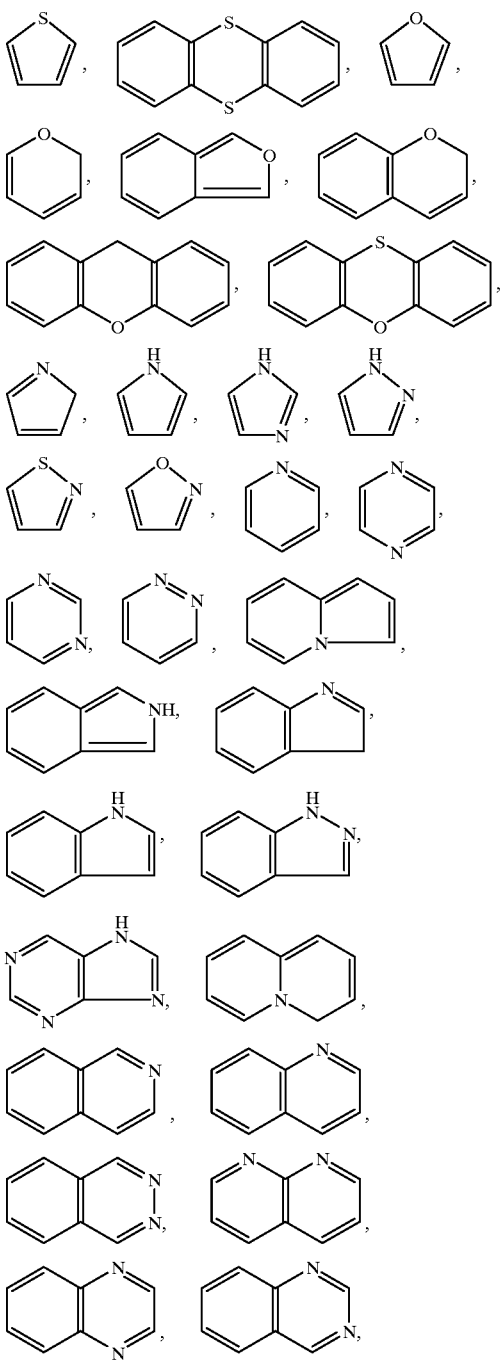

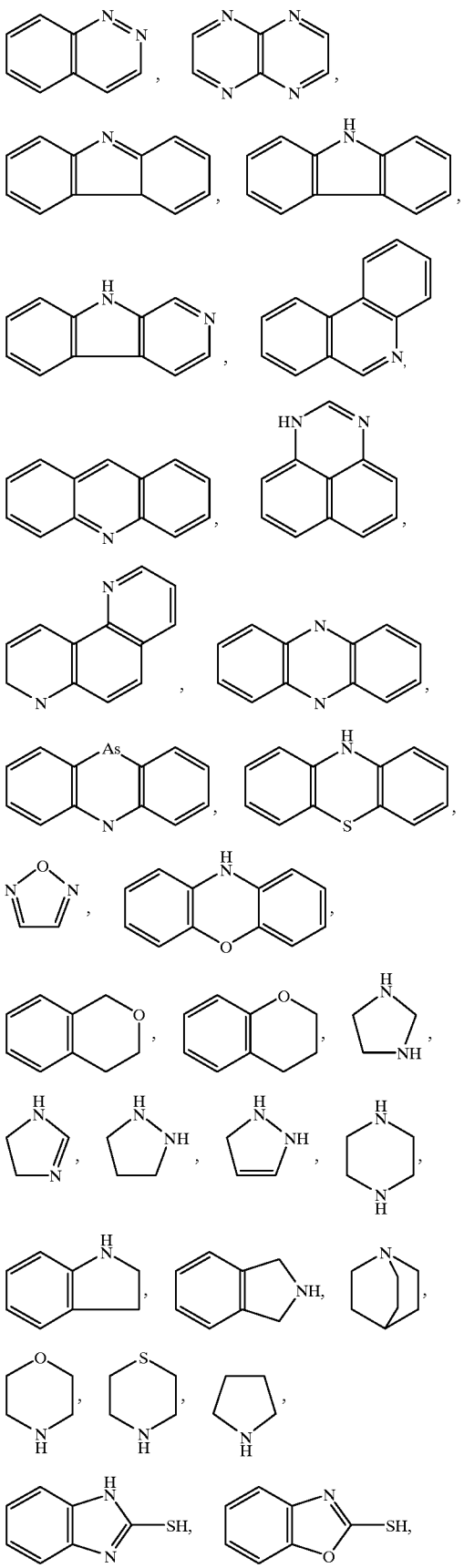

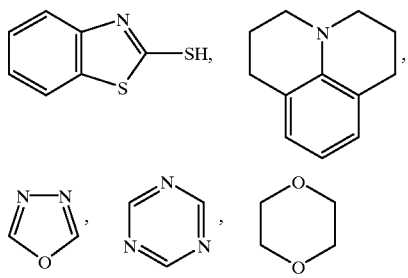

As the substituted oxy groups ($R^5O-$), those in which $R^5$ represents a monovalent non-metallic atomic group exclusive of a hydrogen atom can be used. The preferred examples of the substituted oxy groups include an alkoxyl group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonooxy group, and a phosphonatooxy group. As the alkyl group and the aryl group in these substituted oxy groups, the above-described alkyl groups, substituted alkyl groups, aryl groups and substituted aryl groups can be exemplified. As $R^6$ in the acyl group ($R^6CO-$) in the acyloxy groups, the above-described alkyl groups, substituted alkyl groups, aryl groups, and substituted aryl groups can be exemplified. Of the above substituted oxy groups, an alkoxyl group, an aryloxy group, an acyloxy group, and an arylsulfoxy group are more preferred. The specific examples of the preferred substituted oxy groups include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group, and a phosphonatooxy group.

As the substituted thio groups ($R^7S-$), those in which $R^7$ represents a monovalent non-metallic atomic group exclusive of a hydrogen atom can be used. The preferred examples of the substituted thio groups include an alkylthio group, an arylthio group, an alkyldithio group, an aryldithio group and an acylthio group. As the alkyl group and the aryl group in these substituted thio groups, the above-described alkyl groups, substituted alkyl groups, aryl groups, and substituted aryl groups can be exemplified. $R^6$ in the acyl group ($R^6CO-$) in the acylthio groups is the same as described above. Of the above-described substituted thio groups, an alkylthio group and an arylthio group are more preferred. The specific examples of the preferred substituted thio groups include a methylthio group, an ethylthio group, a phenylthio group, an ethoxyethylthio group, a carboxyethylthio group, and a methoxycarbonylthio group.

As the substituted amino groups ($R^8NH-$, ($R^9$)($R^{10}$)N—), those in which $R^8$, $R^9$ and $R^{10}$ each represents a monovalent non-metallic atomic group exclusive of a hydrogen atom can be used. The preferred examples of the substituted amino groups include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, and an N-aryl-N-aryloxycarbonylamino group. As the alkyl group and the aryl group in these substituted amino groups, the above-described alkyl groups, substituted alkyl groups, aryl groups, and substituted aryl groups can be exemplified. $R^6$ in the acyl group ($R^6CO-$) in the above acylamino group, N-alkylacylamino group and N-arylacylamino group has the same meaning as described above. Of the above-described substituted amino groups, an N-alkylamino group, an N,N-dialkylamino group, an N-arylamino group, and an acylamino are more preferred. The specific examples of the preferred substituted amino groups include a methylamino group, an ethylamino group, a diethylamino group, a morpholino group, a piperidino group, a pyrrolidino group, a phenylamino group, a benzoylamino group, and an acetylamino group.

As the substituted carbonyl groups ($R^{11}CO-$), those in which $R^{11}$ represents a monovalent non-metallic atomic group can be used. The preferred examples of the substituted carbonyl groups include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, and an N-alkyl-N-arylcarbamoyl group. As the alkyl group and the aryl group in these substituted carbonyl groups, the above-described alkyl groups, substituted alkyl groups, aryl groups, and substituted aryl groups can be exemplified. Of the above-described substituted carbonyl groups, a formyl group, an acyl group, a carboxyl group, an alkoxycarbonyl group, an aryloxycarbonyl group, a carbamoyl group, an N-alkylcarbamoyl group, an N,N-dialkylcarbamoyl group, and an N-arylcarbamoyl group are more preferred, and a formyl group, an acyl group, an alkoxycarbonyl group, and an aryloxycarbonyl group are still more preferred. The specific examples of the preferred substituted carbonyl groups include a formyl group, an acetyl group, a benzoyl group, a carboxyl group, a methoxycarbonyl group, an allyloxycarbonyl group, an N-methylcarbamoyl group, an N-phenylcarbamoyl group, an N,N-diethylcarbamoyl group, and a morpholinocarbonyl group.

As the substituted sulfinyl groups ($R^{12}SO-$), those in which $R^{12}$ represents a monovalent non-metallic atomic group can be used. The preferred examples of the substituted sulfinyl groups include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group, and an N-alkyl-N-arylsulfinamoyl group. As the alkyl group and the aryl group in these substituted sulfinyl groups, the above-described alkyl groups, substituted alkyl groups, aryl groups, and substituted aryl groups can be exemplified. Of the above-described substituted sulfinyl groups, an alkylsulfinyl group and an arylsulfinyl group are more preferred. The specific examples of the substituted sulfinyl groups include a hexylsulfinyl group, a benzylsulfinyl group, and a tolylsulfinyl group.

As the substituted sulfonyl groups ($R^{13}SO_2$—), those in which $R^{13}$ represents a monovalent non-metallic atomic group can be used. The preferred examples of the substituted sulfonyl groups include an alkylsulfonyl group and an arylsulfonyl group. As the alkyl group and the aryl group in these substituted sulfonyl groups, the above-described alkyl groups, substituted alkyl groups, aryl groups, and substituted aryl groups can be exemplified. The specific examples of the substituted sulfonyl groups include a butylsulfonyl group and a chlorophenylsulfonyl group.

The sulfonato group (—$SO_3$—) means a conjugate base anion group of a sulfo group (—$SO_3H$) as described above and, in general, they are preferably used with a counter cation. As such a counter cation, generally used various oniums (e.g., ammoniums, sulfoniums, phosphoniums, iodoniums, aziniums) and metal ions (e.g., $Na^+$, $K^+$, $Ca^{2+}$, $Zn^{2+}$) can be exemplified.

The carboxylato group (—$CO_2$—) means a conjugate base anion group of a carboxyl group ($CO_2H$) as described above and, in general, they are preferably used with a counter cation. As such a counter cation, generally used various oniums (e.g., ammoniums, sulfoniums, phosphoniums, iodoniums, aziniums) and metal ions (e.g., $Na^+$, $K^+$, $Ca^{2+}$, $Zn^{2+}$) can be exemplified.

The substituted phosphono group means a group obtained by substituting one or two hydroxyl group(s) on a phosphono group with other organic oxo group(s), and the preferred examples include the above-described dialkylphosphono group, diarylphosphono group, alkylarylphosphono group, monoalkylphosphono group and monoarylphosphono group. Of these groups, the dialkylphosphono group and the diarylphosphono group are preferred. The specific examples of these substituted phosphono groups include a diethylphosphono group, a dibutylphosphono group, and a diphenylphosphono group.

The phosphonato group (—$PO_3^{2-}$, —$PO_3H^-$) means a conjugate base anion group of a phosphono group (—$PO_3H_2$) resulting from primary acid dissociation or secondary acid dissociation as described above. In general, they are preferably used with a counter cation. As such a counter cation, generally used various oniums (e.g., ammoniums, sulfoniums, phosphoniums, iodoniums, aziniums) and metal ions (e.g., $Na^+$, $K^+$, $Ca^{2+}$, $Zn^{2+}$) can be exemplified.

The substituted phosphonato group is, of the above-described substituted phosphono groups, a conjugate base anion group of a group obtained by substituting one hydroxyl group with an organic oxo group, and specific examples include the conjugate base groups of the above-described monoalkylphosphono group (—$PO_3H$(alkyl)) and a monoarylphosphono group (—$PO_3H$(aryl)). In general, they are preferably used with a counter cation. As such a counter cation, generally used various oniums (e.g., ammoniums, sulfoniums, phosphoniums, iodoniums, aziniums) and metal ions (e.g., $Na^+$, $K^+$, $Ca^{2+}$, $Zn^{2+}$) can be exemplified.

In the above formula (I), A more preferably represents an organic group containing an aromatic group, and W preferably represents a nonionic organic group containing a polyoxyalkylene group.

The specific examples of A–H and W–H are shown below.

Examples of A–H

①  log P = 2.05

② 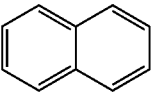 3.05

③ 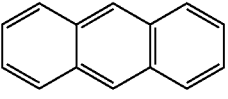 4.05

④ 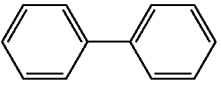 3.73

⑤ 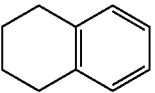 3.27

⑥ 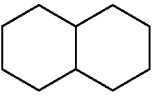 3.33

⑦  2.38

⑧ Straight chain or branched $C_nH_{2n+2}$ (an integer of n ≥ 4)
log P = 2.09 (in the case of butane)

⑨ Straight chain or branched $C_nH_{2n}$ (an integer of n ≥ 4)

⑩ Straight chain or branched $C_nH_{2n-2}$ (an integer of n ≥ 4)

The above-described substituent on the hydrocarbon group may be substituted with the hydrogen atoms of the above structural formulae ① to ⑩.

Examples of W–H log P

① HO—(CH₂CH₂O)ₙ—H  {−0.71(n = 1), −1.37(n = 5)
−2.19(n = 10), −3.02(n = 15)
(an integer of n ≥ 1)

② HO—(CHCH₂O)ₙ—H   (−0.30(n = 1), 0.70(n = 5))
(an integer of n ≥ 1)

③ HO—(CH₂CH₂O)ₙ—(CHCH₂O)ₘ—H
(integers of n ≥ 1, m > 1)

④ HS—(CH₂CH₂O)ₙ—H
(an integer of n ≥ 1)

⑤ HO—(CH₂CH₂CH₂O)ₙ—H
(an integer of n ≥ 1)

⑥ HO—(CH₂CHN)ₙ—H
       H
(an integer of n ≥ 1)

⑦ H₂N—(CH₂CH₂N)ₙ—H
      |
      H
(an integer of n ≥ 1)

⑧ α—(CH₂CH)ₙ—ω
        |
        OH
(an integer of n ≥ 1)

⑨ α—(CH₂CH)ₙ—ω
        |
        NH₂
(an integer of n ≥ 1)

⑩ α—(CH₂CH)ₙ—ω
        |
        C≡N
(an integer of n ≥ 1)

⑪ α—(CH₂CH)ₙ—ω
        |
        CONH₂
(an integer of n ≥ 1)

⑫ α—(CH₂CH)ₙ—ω
        |
        CH₂OH
(an integer of n ≥ 1)

α and ω each represents
—OH, —H, —SH or —NH₂

⑬
α—(CH₂CH)ₙ—ω
    |
    CH₂NH₂
(an integer of n ≥ 1)

⑭
α—(CH₂CH)ₙ—ω
    |              OH
    CO₂‾‾‾‾‾‾‾‾/
(an integer of n ≥ 1)

The above-described substituent on the hydrocarbon group may be substituted with the hydrogen atoms of the above structural formulae ① to ⑭.

The examples of the nonionic compounds represented by formula (I) are shown below.

Examples of the Compounds Represented by Formula (I)

A—W

Y-1 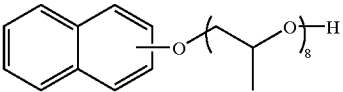

Y-2 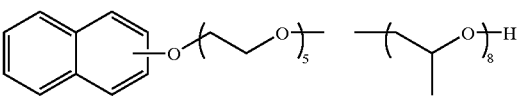

Y-3 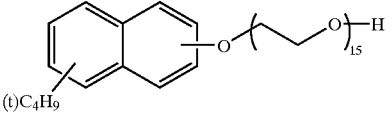

Examples of the Compounds Represented by Formula (I)

A—W

Y-4 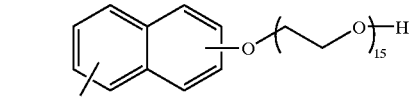

Y-5 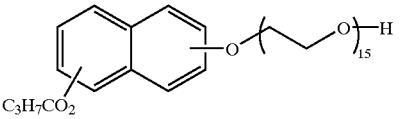

Y-6 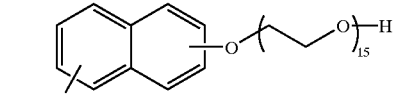
(t)C₄H₉

T-7 
(n)C₈H₁₇O

Y-8 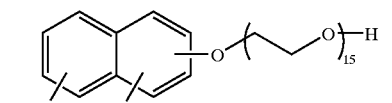
C₃H₇CO₂

Y-9 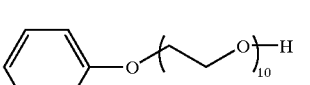
(CH₃)₂N

Y-10 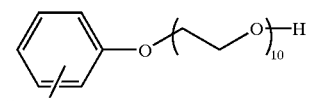
(n)C₆H₁₃NHCO

Y-11 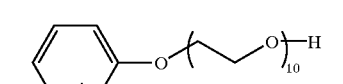
(t)C₄H₉   (t)C₄H₉

Y-12 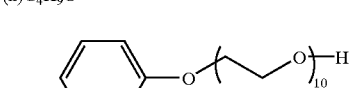

Y-13
(t)C₄H₉

Y-14
(n)C₄H₉O

Y-15
(n)C₆H₁₃CO₂

Examples of the Compounds Represented by Formula (I)

A—W

Y-16
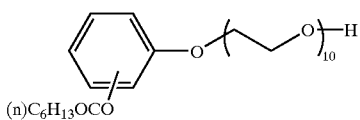

Y-17
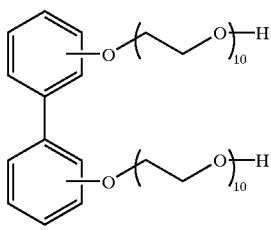

Y-18
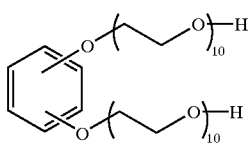

Y-19
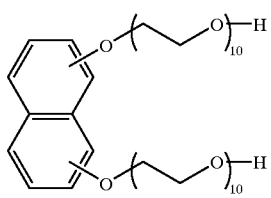

Y-20
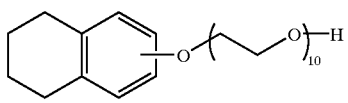

Y-21
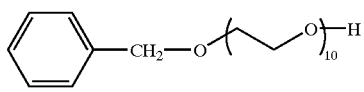

Y-22
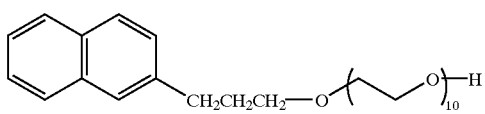

The nonionic compound represented by formula (I) is more preferably represented by the following formula (I-A) or (I-B):

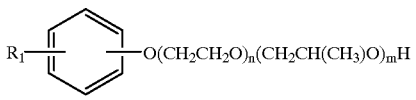 (I-A)

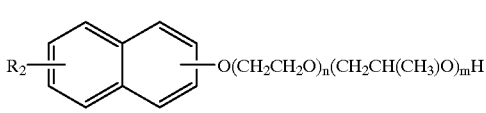 (I-B)

wherein $R_1$ and $R_2$ each represents H or an alkyl group having from 1 to 100 carbon atoms, and n and m each represents an integer of from 0 to 100.

The examples of the compounds represented by formula (I-A) include polyoxyethylene phenyl ether, polyoxyethylene methylphenyl ether, polyoxyethylene octylphenyl ether, and polyoxyethylene nonylphenyl ether.

The examples of the compounds represented by formula (I-B) include polyoxyethylene naphthyl ether, polyoxyethylene methylnaphthyl ether, polyoxyethylene octylnaphthyl ether, and polyoxyethylene nonylnaphthyl ether.

In the compound represented by formula (I-A) or (I-B), the number of the repeating unit of polyoxyethylene chain is preferably from 3 to 50, more preferably from 5 to 30, and the number of the repeating unit of polyoxypropylene chain is preferably from 0 to 10, more preferably from 0 to 5. The polyoxyethylene moiety and polyoxypropylene moiety may be a random copolymer or a block copolymer.

The nonionic aromatic ether-based activator represented by formula (I-A) or (I-B) may be used alone or in combination of two or more.

Similarly to the polyoxyalkylene ethers represented by formula (I-A) or (I-B), the nonionic compound having a polyoxyalkylene ether group (i.e., a nonionic surfactant) represented by the following formula (I-C) may be used in the developing solution for use in the present invention as the preferred nonionic compound represented by formula (I).

As the surfactant having a polyoxyalkylene ether group, the compound represented by the following formula (I-C) is preferably used:

$$R^1-O-(R^2-O)_nH \qquad (I-C)$$

wherein $R^1$ represents an alkyl group having from 3 to 15 carbon atoms which may have a substituent, an aromatic hydrocarbon group having from 6 to 15 carbon atoms which may have a substituent, or a heterocyclic aromatic group having from 4 to 15 carbon atoms which may have a substituent (as the substituents, an alkyl group having from 1 to 20 carbon atoms, a halogen atom, e.g., Br, Cl and I, an aromatic hydrocarbon group having from 6 to 15 carbon atoms, an aralkyl group having from 7 to 17 carbon atoms, an alkoxyl group having from 1 to 20 carbon atoms, an alkoxycarbonyl group having from 2 to 20 carbon atoms, and an acyl group having from 2 to 15 carbon atoms can be exemplified); $R^2$ represents an alkylene group having from 1 to 100 carbon atoms which may have a substituent (as the substituents, an alkyl group having from 1 to 20 carbon atoms and an aromatic hydrocarbon group having from 6 to 15 carbon atoms can be exemplified); and n represents an integer of from 1 to 100.

The $(R^2-O)_n$ moiety in formula (I) may be two or three groups within the above range. Specifically, random or block copolymers of a combination of an ethyleneoxy group and a propyleneoxy group, a combination of an ethyleneoxy group and an isopropyloxy group, a combination of an ethyleneoxy group and a butyleneoxy group, and a combination of an ethyleneoxy group and an isobutylene group can be exemplified.

By containing the nonionic surfactant having a polyoxyalkylene ether group in the developing solution for use in the present invention, the dissolution of the photosensitive layer in an unexposed domain is accelerated and the osmosis property of the developing solution to an exposed domain is reduced.

The effective addition amount of the nonionic compound represented by formula (I) is from 1 to 30 wt %, preferably from 1 to 20 wt %, more preferably from 2 to 20 wt %, and most preferably from 2 to 10 wt %, in the developing solution.

If the addition amount is too small, developing property and the solubility of the components of a photosensitive layer are reduced, while when it is too much, the press life (i.e., the printing durability) of a printing plate is deteriorated.

Chelating Agent

The developing solution according to the present invention may contain a chelating agent. Examples of chelating agents include polyphosphate, (e.g., $Na_2P_2O_7$, $Na_5P_3O_3$, $Na_3P_3O_9$, $Na_2O_4P(NaO_3P)PO_3Na_2$, Calgon (sodium polymetaphosphate)); aminopolycarboxylic acids, (e.g., ethylenediaminetetraacetic acid, potassium salt of it, sodium salt of it; diethylenetriaminepentaacetic acid, potassium salt of it, sodium salt of it; triethylenetetraminehexaacetic acid, potassium salt of it, sodium salt of it; hydroxyethyl ethylenediaminetriacetic acid, potassium salt of it, sodium salt of it; nitrilotriacetic acid, potassium salt of it, sodium salt of it; 1,2-diaminocyclohexanetetraacetic acid, potassium salt of it, sodium salt of it; 1,3-diamino-2-propanoltetraacetic acid, potassium salt of it, sodium salt of it); organic phosphonic acids, (e.g., 2-phosphonobutane-1,2,4-tricarboxylic acid, potassium salt of it, sodium salt of it; 2-phosphonobutanone-2,3,4-tricarboxylic acid, potassium salt of it, sodium salt of it; 1-phosphonoethane-1,2,2-tricarboxylic acid, potassium salt of it, sodium salt of it; 1-hydroxyethane-1,1-diphosphonic acid, potassium salt of it, sodium salt of it; aminotri(methylenephosphonic acid), potassium salt of it, sodium salt of it). The optimal amount of these chelating agents is various according to the hardness of the hard water to be used and the use amount of the water, but generally the amount is from 0.01 to 5 wt %, preferably from 0.01 to 0.5 wt %, in the working developing solution.

Alkali Agent

The developing solution for use in the present invention is an alkaline aqueous solution containing the nonionic compound represented by formula (I). As the alkali agents to be added, inorganic alkali agents, e.g., sodium tertiary phosphate, potassium tertiary phosphate, ammonium tertiary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, potassium hydroxide, ammonium hydroxide, and lithium hydroxide, and in addition, an organic alkali agent, e.g., monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide can be used for the purpose of delicately adjusting alkali concentration and assisting dissolution of a photosensitive layer.

These alkali agents may be used alone or two or more in combination.

Surfactant

In addition to the above nonionic compound represented by formula (I), various surfactants may be added to the developing solution for use in the present invention, as shown below.

The examples of other surfactants which can be used in the present invention include nonionic surfactants such as polyoxyethylene alkyl ethers, e.g., polyoxyethylene lauryl ether, polyoxyethylene cetyl ether, and polyoxyethylene stearyl ether, polyoxyethylene alkylaryl ethers, e.g., polyoxyethylene octylphenyl ether and polyoxyethylene nonylphenyl ether, polyoxyethylene alkyl esters, e.g., polyoxyethylene stearate, sorbitan alkyl esters, e.g., sorbitan monolaurate, sorbitan monostearate, sorbitan distearate, sorbitan monooleate, sorbitan sesquistearate, and sorbitan trioleate, and monoglyceride alkyl esters, e.g., glycerol monostearate and glycerol monooleate; anionic surfactants such as alkylbenzenesulfonates, e.g., sodium dodecylbenzenesulfonate, alkylnaphthalenesulfonates, e.g., sodium butylnaphthalenesulfonate, sodium pentylnaphthalenesulfonate, sodium hexylnaphthalenesulfonate, and sodium octylnaphthalenesulfonate, alkylsulfates, e.g., sodium lauryl sulfate, alkylsulfonates, e.g., sodium dodecylsulfonate, and sulfosuccinates, e.g., sodium dilaurylsulfosuccinate; and ampholytic surfactants such as alkyl betaines, e.g., lauryl betaine and stearyl betaine, and aminoacids. Of these, particularly preferred surfactants are anionic surfactants such as alkylnaphthalenesulfonates.

These surfactants can be used alone or in combination. The content of these surfactants in a developing solution is preferably from 0.1 to 20 wt % calculated in terms of effective components.

Other Components

In addition to the above-described components, if necessary, various components can be added to the developing solution for use in the present invention. For example, organic carboxylic acids, e.g., benzoic acid, phthalic acid, p-ethylbenzoic acid, p-n-propylbenzoic acid, p-isopropylbenzoic acid, p-n-butylbenzoic acid, p-t-butylbenzoic acid, p-2-hydroxyethylbenzoic acid, decanoic acid, salicylic acid and 3-hydroxy-2-naphthoic acid; organic solvents, e.g., isopropyl alcohol, benzyl alcohol, ethyl cellosolve, butyl cellosolve, phenyl cellosolve, propylene glycol, and diacetone alcohol; in addition, chelating agents, reducing agents, dyes, pigments, water softeners and antiseptics can be used.

In view of the processing stability, it is preferred that carbonic acid or carbonate be added to the developing solution for use in the present invention. In general, the developing agent is neutralized with carbonic acid gas in the air and comes to be fatigued, but it is thought that the addition of carbonic acid or carbonate to the developing solution in advance is effective to prevent the fatigue due to carbonic acid gas from occurring by chemical equilibrium.

Further, when the printing plate of the present invention is development processed with an automatic processor, since the developing solution becomes fatigued with the processing amount, the processing ability maybe restored with a replenisher or a fresh developing solution.

The properties of the developing solution are described below.

pH.

The developing solution according to the present invention is an alkaline aqueous solution having a pH value of 12.5, preferably from 10.0 to 12.5, more preferably from 11.0 to 12.5, and particularly preferably from 11.0 to 12.0, in view of the developing speed.

If the pH value is lower than the above range, image is difficult to be formed, while if it exceeds the above range, over-development may occur or the exposed domain may be damaged severely due to development.

Electrical Conductance

The electrical conductance of the developing solution according to the present invention is 30 mS/cm or less, preferably from 3 to 30 mS/cm, more preferably from 3 to 20 mS/cm, still more preferably from 3 to 15 mS/cm, and especially preferably from 5 to 15 mS/cm, in view of the developing speed.

If the electrical conductance exceeds the above range, since the concentration of the salt becomes high, the dissolution speed of a photosensitive layer becomes extremely slow, as a result, the residual film is liable to occur in the unexposed domain.

Foaming

A developing solution (30 ml) is put in a transparent glass bottle having an inner diameter of 3 cm and a capacity of 100 ml and the bottle is shaken up and down at 25° C. at a rate of three times a second for one minute, and then the bottle is allowed to stand and the time until the foams disappear (time of defoaming) is measured. The smaller the time, the lower is foaming (defoaming property is high).

The developing solution according to the present invention is preferably low in foaming, time of defoaming is 5 minutes or less, and the development processing step is not interfered with by foaming at development processing.

Color

The developing solution according to the present invention is colorless, preferably colored slightly in a degree of capable of obtaining visibility for the purpose of preventing mistaking the developing solution for water.

Viscosity

The viscosity of the developing solution according to the present invention is preferably from 1.0 to 10.0 cp at 25° C. in a diluted state with water, thereby the development processing progresses smooth.

Photosensitive Lithographic Printing Plate

The photosensitive lithographic printing plate for use in the present invention is described below.

Photosensitive Layer

The photosensitive layer of the photosensitive lithographic printing plate precursor according to the present invention is described in the first place.

The photosensitive layer of the photosensitive lithographic printing plate according to the present invention is not particularly restricted but it is preferably a negative type photopolymerizable photosensitive layer capable of laser imaging.

The main components of a photopolymerizable photosensitive layer comprises:

a) a compound having an addition polymerizable ethylenically unsaturated double bond, b) a high polymer which is soluble or swellable in an alkaline aqueous solution (a high polymer binder), c) a photopolymerization initiator.

Various compounds, e.g., a colorant, a plasticizer, a thermal polymerization inhibitor, are used, if necessary.

The compound having an ethylenically unsaturated double bond is a compound having an ethylenically unsaturated double bond which undergoes addition polymerization, crosslinking and curing by the function of a photopolymerization initiator when the photopolymerizable photosensitive composition is irradiated with actinic radiation.

The compound having an addition polymerizable ethylenically unsaturated double bond can be arbitrarily selected from among the compounds having at least one, preferably two or more, ethylenically unsaturated double bonds at terminals.

Such compounds have, for example, the chemical form of a monomer, a prepolymer, i.e., a dimer, a trimer, and an oligomer or a mixture and a copolymer of them.

As examples of monomers and copolymers of them, esters of unsaturated carboxylic acids (e.g., acrylic acid, methacrylic acid, itaconic acid, crotonic acid, isocrotonic acid, maleic acid, etc.), and aliphatic polyhydric alcohol compounds, and amides of unsaturated carboxylic acids and aliphatic polyhydric amine compounds are exemplified.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]-dimethylmethane, bis[p-(methacryloxyethoxy)phenyl]dimethylmethane, etc.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

Further, the mixtures of the above-described ester monomers can also be exemplified.

Further, specific examples of amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As other example, as is disclosed in JP-B-48-41708 (the term "JP-B" as used herein means an "examined Japanese patent publication"), a vinyl urethane compound having two or more polymerizable vinyl groups in one molecule can be exemplified, which is obtained by the addition of a vinyl monomer having a hydroxyl group represented by the following formula (A) to a polyisocyanate compound having two or more isocyanate groups in one molecule can be exemplified.

  (A)

wherein $R_3$ and $R_4$ each represents H or $CH_3$.

As other examples, urethane acrylates as disclosed in JP-A-51-37193 and JP-B-2-32293, polyfunctional acrylates and methacrylates, such as polyester acrylates, and epoxy acrylates obtained by reacting epoxy resins with (meth) acrylic acids as disclosed in JP-A-48-64183, JP-B-49-43191 and JP-B-52-30490 can be exemplified. Moreover, photocurable monomers and oligomers introduced into *Bulletin of Nihon Setchaku Kyokai*, Vol. 20, No. 7, pp. 300–308 (1984) can be used as well. The use amount of these ethylenically unsaturated compounds is generally from 5 to 80 wt %, preferably from 5 to 70 wt %, more preferably from 10 to 70 wt %, and most preferably from 30 to 50 wt %, based on the total components (hereinafter, wt % is abbreviated merely to %).

The high polymers soluble or swellable in alkali water which are used in the photosensitive layer of the photosensitive lithographic printing plate according to the present invention are selected not only as a film-forming agent of the composition of the photosensitive layer but according to the use of the alkali developing agent. For example, when water-soluble organic high polymers are used, water development becomes possible. As such organic high polymers, addition polymers having a carboxylic acid group at the side chain, e.g., the polymers disclosed in JP-A-59-44615, JP-B-54-34327, JP-B-58-12577, JP-B-54-25957, JP-A-54-92723, JP-A-59-53836 and JP-A-59-71048, i.e., a methacrylic acid copolymer, an acrylic acid copolymer, an itaconic acid copolymer, a crotonic acid copolymer, a maleic acid copolymer, and a partially esterified maleic acid copolymer, can be exemplified.

Acidic cellulose derivatives having a carboxylic acid group at the side chain can also be used. Besides the above, the polymers obtained by adding a cyclic acid anhydride to an addition polymer having a hydroxyl group are also useful. Of these polymers, in particular, copolymers of [benzyl (meth)-acrylate-(meth)acrylic acid—other addition polymerizable vinyl monomer according to necessity] and [allyl (meth)-acrylate-(meth)acrylic acid—other addition polymerizable vinyl monomer according to necessity] are advantageously used in the present invention. Further, as water-soluble organic polymers, polyvinyl pyrrolidone and polyethylene oxide are useful. For increasing the strength of cured films, alcohol-soluble polyamide and polyether of 2,2-bis (4-hydroxyphenyl)propane and epichlorohydrin are also useful.

The urethane resins disclosed in JP-B-7-120040, JP-B-7-120041, JP-B-7-120042, JP-B-8-12424, JP-A-63-287944, JP-A-63-287947, JP-A-1-271741, and JP-A-11-352691 are also useful for the use of the present invention.

By introducing radical reactive groups into the side chain of these high polymers, the strength of the cured film can be improved. A group having an ethylenically unsaturated bond, an amino group and an epoxy group can be exemplified as an addition polymerization reactive functional group, a mercapto group, a thiol group, a halogen atom, a triazine structure and an onium structure can be exemplified as a functional group capable of becoming a radical by irradiation, and a carboxyl group and an imido group can be exemplified as a polar group. As the above addition polymerization reactive functional group, a group having an ethylenically unsaturated bond, e.g., an acryl group, a methacryl group, an allyl group, and a styrene group, is particularly preferred, but functional groups selected from among an amino group, a hydroxyl group, a phosphonic acid group, a phosphoric acid group, a carbamoyl group, an isocyanate group, a ureido group, a ureylene group, a sulfonic acid group and an ammonium group are also useful.

For maintaining the developing properties of the composition, it is preferred that the high polymer of the present invention should have an appropriate molecular weight and an acid value. It is preferred to use a high polymer (binder) having a weight average molecular weight of from 5,000 to 300,000 and an acid value of from 0.2 to 5.0 meq/g to be processed with the above-described developing solution.

For maintaining the developing properties of the composition, it is preferred that the high polymer (binder) of the present invention should have an appropriate molecular weight and an acid value, e.g., a high polymer having a weight average molecular weight of from 5,000 to 300,000 and an acid value of from 20 to 200 is effectively used.

These organic high polymers can be mixed in the entire composition of the photosensitive layer in an arbitrary amount. If the amount exceeds 90 wt %, sufficient image strength cannot be obtained. The amount is preferably from 10 to 90 wt %, more preferably from 30 to 80 wt %. It is preferred that the ratio of the photopolymerizable ethylenically unsaturated compound to the organic high polymer be from 1/9 to 9/1, more preferably from 2/8 to 8/2, and still more preferably from 3/7 to 7/3, by weight.

As the photopolymerizable initiators for use in the photosensitive layer of the photosensitive lithographic printing plate according to the present invention, various kinds of photopolymerization initiator well-known by patents and literature can be used arbitrarily according to the wavelength of the light sources to be used. These photopolymerization initiators may be used in combination of two or more.

When a visible light of 400 nm or more, an Ar laser, a second harmonic wave of a semiconductor laser, or an SHG-YAG laser is used as a light source, various photopolymerization initiators are suggested. For example, a certain kind of photoreducing dyes as disclosed in U.S. Pat. No. 2,850,445, e.g., Rose Bengale, Eosine and Erythrosine, or series comprising a combination of a dye and a photopolymerization initiator, e.g., a composite initiator comprising a dye and an amine (JP-B-44-20189), series comprising a combination of a hexaarylbiimidazole, a radical generator and a dye (JP-B-45-37377), series comprising a hexaarylbiimidazole and a p-dialkylaminobenzylidene ketone (JP-B-47-2528, JP-A-54-155292), series comprising a cyclic cis-α-dicarbonyl compound and a dye (JP-A-48-84183), series comprising a cyclic triazine and a merocyanine dye (JP-A-54-151024), series comprising a 3-ketocoumarin and an activator (JP-A-52-112681, JP-A-58-15503), series comprising a biimidazole, a styrene derivative and a thiol (JP-A-59-140203), series comprising an organic peroxide and a dye (JP-A-59-1504, JP-A-59-140203, JP-A-59-189340, JP-A-62-174203, JP-B-62-1641, U.S. Pat. No. 4,766,055), series comprising a dye and an active halogen compound (JP-A-63-258903, JP-A-2-63054), series comprising a dye and a borate compound (JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348, JP-A-1-138204), series comprising a dye having a rhodanine ring and a radical generator (JP-A-2-179643, JP-A-2-244050), series comprising a titanocene and a 3-ketocoumarin dye (JP-A-63-221110), series comprising a combination of a titanocene, a xanthene dye, and an addition polymerizable ethylenically unsaturated compound having an amino group or a urethane group (JP-A-4-221958, JP-A-4-219756), series comprising a titanocene and a specific merocyanine dye (JP-A-6-295061), and series comprising a titanocene and a dye having a benzopyran ring (JP-A-8-334897) can be exemplified.

In recent years, a laser having wavelength of from 400 to 410 nm (a violet laser) has been developed and photopolymerization initiators having high sensitivity to the wavelength of 450 nm or lower sensitive to this laser have been developed, and these photopolymerization initiators can also be used in the present invention.

For example, a cationic dye/borate series (JP-A-11-84647), a merocyanine dye/titanocene series (JP-A-2000-147763), and a carbazole type dye/titanocene series (JP-A-2001-42524) can be exemplified.

In the present invention, the series in which a titanocene compound is used is particularly excellent in view of sensitivity and preferred.

Various kinds of titanocene compounds can be used, e.g., the titanocene compounds disclosed in JP-A-59-152396 and JP-A-61-151197 can be arbitrarily used. More specifically, dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethyl-cyclopentadienyl-Ti-bis-2,3,4,5,6-pentafluorophen-1-yl, dimethylcyclopentadienyl-Ti-bis-2,6-difluorophen-1-yl, dicyclopentadienyl-Ti-bis-2,6-difluoro-3-(pir-1-yl)phen-1-yl can be exemplified.

It is known that by adding hydrogen-donating compounds, such as thiol compounds, e.g., 2-mercaptobenzothiazole, 2-mercaptobenzimidazole, and 2-mercaptobenzoxazole, and amine compounds, e.g., N-phenylglycine and N,N-dialkylamino aromatic alkyl ester to the above photopolymerization initiators, if necessary, photopolymerization initiating property is further improved.

The auxiliary agents such as amine compounds and thiol compounds may be added to the photopolymerization initiators, if necessary. By the addition of these hydrogen-donating compounds, photopolymerization initiating property can be further improved.

The addition amount of these photopolymerization initiators is from 0.05 to 100 weight parts, preferably from 0.1 to 70 weight parts, and more preferably from 0.2 to 50 weight parts, per 100 weight parts of the ethylenically unsaturated compound.

Besides the above main components, it is preferred for the photosensitive composition for the photosensitive layer according to the present invention to contain a small amount of thermal polymerization inhibitor for inhibiting unnecessary thermal polymerization of an ethylenically unsaturated compound during production or storage. As the appropriate thermal polymerization inhibitors, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene-bis(4-methyl-6-t-butylphenol), N-nitrosophenylhydroxylamine primary cerium salt, and N-nitrosophenylhydroxylamine aluminum salt can be exemplified.

The addition amount of the thermal polymerization inhibitor is preferably from about 0.01% to about 5% based on the weight of the entire composition. Further, if necessary, higher fatty acid derivatives, such as behenic acid and behenic acid amide, may be added to the photosensitive composition of the photosensitive layer and localized on the surface of the photosensitive layer during drying process after coating to inhibit polymerization hindrance due to oxygen. The addition amount of the higher fatty acid derivative is preferably from about 0.5% to about 10% based on the entire composition.

Colorants may be added for the purpose of coloring the photosensitive layer. As the colorants, pigments, e.g., phthalocyanine pigments (C.I. Pigment Blue 15/3, 15/4, 15/6), azo pigments, carbon black and titanium oxide, and dyes such as Ethyl Violet, Crystal Violet, azo dyes, anthraquinone dyes and cyanine dyes can be used. The addition amount of the dye and the pigment is preferably from about 0.5% to about 5% based on the entire composition.

In addition, for improving the physical properties of the cured film, inorganic fillers and plasticizers, e.g., dioctyl phthalate, dimethyl phthalate and tricresyl phosphate may be added.

The addition amount of these compounds is preferably 10% or less based on the entire solid content of the photosensitive layer.

When the photosensitive layer is coated on a support, which is described later, the photosensitive composition of the photosensitive layer is dissolved in various organic solvents before use. Examples of the solvents used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, etc. These solvents may be used alone or may be used as a mixed solvent. The concentration of the solid content in the coating solution is preferably from 1 to 50%.

Surfactants can be added to the photopolymerizable photosensitive layer composition for the purpose of improving the properties of the coated surface.

The dry coating amount of the surfactant is preferably from about 0.1 to about 10 $g/m^2$, more preferably from 0.3 to 5 $g/m^2$, and still more preferably from 0.5 to 3 $g/m^2$.

Acid Value of Photosensitive Layer

The acid value of the photosensitive layer used in the present invention is the equivalent of the acids having pKa of 9 or less contained per g of the layers of the photosensitive composition coated on the support (an overcoat layer coated on the photosensitive layer, e.g., an oxygen-barrier layer is not included) of a photosensitive lithographic printing plate. Acid value of photosensitive layer can be obtained experimentally by titrating the photosensitive layer directly by an aqueous solution of sodium hydroxide, alternatively the acid value of the photosensitive layer can be computed from the content of the compounds having acid radicals having a pKa of 9 or less in the photosensitive composition.

As the specific method of changing the photosensitive layer acid value, there are methods of changing the ratio of the contents of the components of the photosensitive layer, i.e., crosslinking monomer/binder polymer having acid radicals (linear high polymer), and using binder polymers of low acid value having less acid radicals.

As the binder polymers of low acid value, the acid value is preferably 1.5 meq/g or less, more preferably 1.2 meq/g or less.

The photosensitive layer acid value of the photosensitive layer according to the present invention is preferably 1.0 meq/g. It is more effective that the present invention is applied to the lithographic printing plate having a photosensitive layer having the acid value of from 0.20 to 0.60 meq/g, more preferably from 0.30 to 0.50 meq/g, in view of image-forming properties.

Support

The support of the photosensitive lithographic printing plate for use in the present invention is not particularly limited so long as it is a plate-like support having dimensional stability but aluminum support is preferably used.

The aluminum support is selected from aluminum containing dimensionally stable aluminum as a main component, aluminum-containing alloys (e.g., alloys of aluminum and silicon, copper, manganese, magnesium, chromium, zinc, lead, bismuth, nickel, etc.), plastic films or paper laminated or deposited with aluminum or aluminum alloy. A composite sheet comprising a polyethylene terephthalate film having provided thereon an aluminum sheet as disclosed in JP-B-48-18327 is also preferred. The aluminum support is arbitrarily subjected to the later-described surface treatment. The aluminum supports for use in the present invention have a thickness of from about 0.05 to about 1 mm.

Graining Treatment

The techniques of graining the surface of aluminum disclosed in JP-A-56-28893, such as mechanical surface roughening, chemical etching, and electrolytic graining are used in the present invention. Further, an electrochemical method of performing surface graining in an electrolytic solution of hydrochloric acid or nitric acid, and a mechanical method such as a wire brush graining method of scratching the aluminum surface with metal wire, a ball graining method of graining the aluminum surface with an abrading ball and an abrasive, and a brush graining method of graining the aluminum surface with a nylon brush and an abrasive can be used. These graining methods can be used alone or combination of two or more.

Of the above methods, a surface roughening method due to an electrochemical method of performing the surface graining in an electrolytic solution of hydrochloric acid or nitric acid is preferably used in the present invention. The electric current density is generally from 100 $C/dm^2$ to 400 $C/dm^2$. More specifically, it is preferred that electrolysis is carried out in an electrolytic solution containing from 0.1 to 50% of hydrochloric acid or nitric acid at 20 to 100° C. for 1 second to 30 minutes by the electric current density of from 100 to 400 $C/dm^2$.

The aluminum support having been subjected to surface graining treatment is then subjected to chemical etching using an acid or an alkali. When an acid is used as the etching agent, time is taken for destroying minute structure and industrially disadvantageous in the present invention, but an alkali is preferably used as the etching agent.

Alkali agents preferably used in the present invention include sodium hydroxide, sodium carbonate, sodium aluminate, sodium metasilicate, sodium phosphate, potassium hydroxide and lithium hydroxide. The preferred conditions of alkali etching are such that the concentration and the temperature are from 1 to 50 wt % and from 20 to 100° C. respectively, and the solution amount of Al is from 5 to 20 $g/m^3$.

Acid cleaning is performed for removing the smut remaining on the surface of the support after etching. The acids used are nitric acid, sulfuric acid, phosphoric acid, chromic acid, hydrofluoric acid and borofluoric acid. In particular, as the desmutting method after electrochemical surface roughening treatment, a method of bringing the aluminum support into contact with a 15 to 65 wt % solution of sulfuric acid at 50 to 90° C. as disclosed in JP-A-53-12739, and a method of performing alkali etching as disclosed in JP-B-48-28123 can be exemplified.

The surface roughness (Ra) of the aluminum support preferably used in the present invention is from 0.3 to 0.7 μm.

Anodizing Treatment

The thus surface-treated aluminum support is then subjected to anodizing treatment.

Anodizing treatment can be performed by the methods so far been used in this industry. Specifically, anodizing treatment is carried out by applying an alternating or direct electric current to an aluminum support in an electrolytic solution comprising alone or combination of two or more of an aqueous solution or nonaqueous solution of sulfuric acid, phosphoric acid, chromic acid, oxalic acid, sulfamic acid, benzenesulfonic acid, to thereby form an anodic oxidation layer (or film) on the surface of the aluminum support.

The conditions of anodizing treatment vary widely according to the electrolytic solution to be used so that the conditions cannot be determined unconditionally but, in general, the concentration of an electrolytic solution is from 1 to 80 wt %, the temperature is from 5 to 70° C., the electric current density is from 0.5 to 60 $A/dm^2$, voltage is from 1 to 100 V, and the electrolytic time is from 10 to 100 seconds.

Of these anodizing treatments, the method of performing anodizing in a sulfuric acid solution with high electric current density as disclosed in British Patent 1,412,768, and a method of performing anodizing using a phosphoric acid as the electrolytic bath as disclosed in U.S. Pat. No. 3,511,661 are preferably used in the present invention.

In the present invention, the thickness of an anodic oxide film is preferably from 1 to 10 $g/m^2$. When the thickness is 1 $g/m^2$ or less, the printing plate is liable to be scratched, while when it is 10 $g/m^2$ or more, a large quantity of electric power is required, thus uneconomical. The thickness is preferably from 1.5 to 7 $g/m^2$, more preferably from 2 to 5 $g/m^2$.

The aluminum support having been subjected to graining treatment and anodizing treatment may undergo sealing treatment.

Such sealing treatment is performed by immersing the aluminum support in hot water and a hot aqueous solution containing an inorganic or organic salt and a water vapor bath. Further, at this time, the aluminum support may be subjected to surface treatment other than silicate treatment by alkali metal silicate, e.g., immersion in an aqueous solution of potassium fluorozirconate or phosphate.

Further, besides the aluminum support, plate-like materials having dimensional stability are also preferably used as the support of the photosensitive lithographic printing plate of the present invention, e.g., paper, paper laminated with plastics (e.g. ,polyethylene, polypropylene, polystyrene, etc.), a metal plate (e.g., zinc, copper, etc.), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or a plastic film laminated or deposited with the above metals can be exemplified.

Further, it is also preferred to perform surface-hydrophilizing treatment in accordance with that support. As such surface-hydrophilizing treatment, treatment by chemical reaction such as etching, oxidizing, reduction and sol-gel coating, and coating of a specific compound which adsorbs onto the surface of the support can be exemplified.

For example, in the case of an anodized aluminum support, organic compounds particularly having phosphorus series acid atomic groups (e.g., phosphoric acid, phosphonic acid, phosphinic acid) are preferably used.

The photosensitive lithographic printing plate according to the present invention is manufactured by forming the above-described photosensitive layer on the above support. Before coating a photosensitive layer, an organic or inorganic undercoat layer may be provided, if necessary.

Oxygen Barrier Protective Layer

The photosensitive lithographic printing plate according to the present invention may have an oxygen barrier protective layer comprising a water-soluble vinyl polymer as a main component on the photopolymerizable photosensitive layer.

As the water-soluble vinyl polymers contained in the oxygen barrier protective layer, polyvinyl alcohol, and its partial ester, ether, and acetal, and its copolymer containing unsubstituted vinyl alcohol unit of a substantial amount capable of imparting necessary water solubility can be used. Polyvinyl alcohols hydrolyzed from 71 to 100% and have a polymerization degree of from 300 to 2,400 are preferably used. Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, and L-8 (manufactured by Kuraray Co., Ltd.) can be exemplified. As the above copolymers, polyvinylacetate, chloroacetate, propionate, polyvinyl formal, and polyvinyl acetal hydrolyzed from 88 to 100%, and copolymers of them can be used. Other useful copolymers are polyvinylpyrrolidone, gelatin and gum arabic, and they can be used alone or in combination.

As the solvent for coating the oxygen barrier protective layer of the present invention, pure water is preferably used, but alcohols such as methanol and ethanol, and ketones such as acetone, methyl ethyl ketone may be mixed with pure water.

The concentration of the solid content in the coating solution is preferably from 1 to 20 wt %.

Well-known additives such as a surfactant for improving the coating property, and a water-soluble plasticizer for improving physical properties of the film may be added to the oxygen barrier protective layer of the present invention. Examples of water-soluble plasticizers include, e.g., propionamide, cyclohexanediol, glycerin, sorbitol, etc. Water-soluble (meth)acrylate series polymers may be used as well.

The covering amount of the oxygen barrier protective layer is preferably about $0.1/m^2$ to about $15/m^2$, more preferably from $1.0/m^2$ to about $5.0/m^2$, by dry weight.

Plate-making Process

In the plate-making process of a photosensitive lithographic printing plate, if necessary, the plate may be heated all over the surface before exposure, during exposure and from exposure to development. The image-forming reaction in the photosensitive layer is accelerated by heating, which leads to the improvement of sensitivity and press life and the stabilization of sensitivity. Further, for the purpose of improving the image strength and press life, it is effective for the image after development to be subjected to whole image post-heating or whole image exposure. The heating before development is generally preferably performed on moderate condition of 150° C. or lower. If the temperature is too high, a problem that the non-image is fogged occurs. Heating after development is performed on very severe condition, i.e., generally from 200 to 500° C. Lower temperature does not result in sufficient image strengthening effect, while higher temperature leads to the degradation of a support and thermal decomposition of an image part.

The photosensitive lithographic printing plate of the present invention can be exposed by well-known methods with no limitation. Lasers are preferred as light sources, e.g., as available laser light sources of from 350 nm to 600 nm (preferably from 350 nm to 450 nm), the following can be used.

As gas lasers: Ar ion laser (364 nm, 351 nm, 10 mW to 1 W), Kr ion laser (356 nm, 351 nm, 10 mW to 1 W), He—Cd laser (441 nm, 325 nm, 1 mW to 100 mW), As solid state lasers: a combination of 2 times of Nd/YAG ($YVO_4$) and SHG crystals (355 nm, 5 mW to 1 W), a combination of Cr/LiSAF and SHG crystals (430 nm, 10 mW), As semiconductor lasers: $KNbO_3$ ring resonator (430 nm, 30 mW), a combination of waveguide type wavelength converting device and AlGaAs, InGaAs semiconductor (380 nm to 450 nm, 5 mW to 100 mW), a combination of waveguide type wavelength converting device and AlGaInP, AlGaAs semiconductor (300 nm to 350 nm, 5 mW to 100 mW), AlGaInN (350 nm to 450 nm, 5 mW to 30 mW), and As other pulse lasers: $N_2$ laser (337 nm, pulse 0.1 to 10 mJ), XeF (351 nm, pulse 10 to 250 mJ).

Of these, AlGaInN semiconductor laser (commercially available InGaN series semiconductor laser, 400 to 410 nm, 5 to 30 mW) is particularly preferred in view of the wavelength characteristics and the cost.

Besides the above, as available laser light sources of from 450 nm to 700 nm, $Ar^+$ laser (488 nm), YAG-SHG laser (532 nm), He—Ne laser (633 nm), He—Cd laser, and red semiconductor laser (from 650 to 690 nm); and as available laser light sources of from 700 nm to 1,200 nm, semiconductor laser (from 800 to 850 nm), Nd-YAG laser (1,064 nm), and FD-YAG laser can be very preferably used.

As other exposure rays, a mercury lamp of ultra-high pressure, high pressure, intermediate pressure and low pressure, a chemical lamp, a carbon arc lamp, a xenon lamp, a metal halide lamp, and various ultraviolet laser lamps (e.g., ArF excimer laser, KrF excimer laser, etc.), a halogen lamp, a fluorescent lamp, a tungsten lamp, and as radiation, electron rays, X-rays, ion beams, far infrared rays can also be used. The above laser light sources of 350 nm or more are particularly preferred in the point of inexpensiveness.

The exposure apparatuses may be any type of an internal drum type, an external drum type, or a flat bed type. By using highly water-soluble components in the photosensitive layer of the photosensitive lithographic printing plate of the present invention, the printing plate can be made soluble in neutral water or weak alkaline aqueous solution, but at the same time, the printing plate can be subjected to on-press exposure and development after mounted on a lithographic printing machine.

For the purpose of increasing the curing rate of the photopolylmerizable photosensitive layer, a heating step of from 50° C. to 150° C. for 1 second to 5 minutes may be provided during the period after image exposure until development.

As described above, an overcoat layer having oxygen barrier properties is generally provided on the photosensitive layer of the photo sensitive lithographic printing plate of the present invention. The removal of the overcoat layer and the unexposed domain of the photosensitive layer may be performed by the developing solution of the present invention at the same time, or the overcoat layer may be removed first with water or warm water and then the unexposed domain of the photosensitive layer may be removed. The antiseptics as disclosed in JP-A-10-10754 and the organic solvents as disclosed in JP-A-8-278636 may be added to these water and warm water.

The development of the photosensitive lithographic printing plate of the present invention with the above developing solution is performed according to ordinary method at temperature of from 0 to 60°, preferably from 15 to 40° C. in a manner that the exposure processed photosensitive lithographic printing plate is immersed in the developing solution and rubbed with a brush.

Further, when development processing is performed with an automatic processor, since the developing solution becomes fatigued with the processing amount, the processing ability may be restored with a replenisher or a fresh developing solution.

The thus development processed photosensitive lithographic printing plate is post-processed with washing water, a rinsing solution containing a surfactant, and a desensitizing solution containing gum arabic and a starch derivative as disclosed in JP-A-54-8002, JP-A-55-115045 and JP-A-59-58431. These processes may be used in the post-processing of the photosensitive lithographic printing plate of the present invention in various combinations.

The press life of the printing plate obtained through various processes as described above can be improved by post-exposure process and heating process such as burning according to the method as disclosed in JP-A-2000-89478.

The lithographic printing plate obtained through these processes is loaded on an offset printing machine and used for printing a lot of sheets.

EXAMPLE

The present invention is explained in more detail with reference to the following examples, but the present invention should not be construed as being limited thereto.
Support
Support 1: Anodized Aluminum Support A 1S aluminum plate having a thickness of 0.30 mm was subjected to brush-graining treatment using a No. 8 nylon brush and a suspension of 800 mesh pumice and water, and the surface of the plate was thoroughly washed with water. The etching was effected by immersing the plate in a 10% sodium hydroxide aqueous solution at 70° C. for 60 seconds, the plate was further washed with flowing water, then washed with a 20% $HNO_3$ aqueous solution for neutralization followed by washing with water. Under the condition of $V_A$ of 12.7 V using alternating waveform electric current of sine wave, the plate was subjected to electrolytic surface roughening treatment in a 1% nitric acid aqueous solution by the quantity of electricity of 300 $C/dm^2$ at anode. The surface roughness measured was 0.45 μm (Ra). Subsequently, the plate was immersed in a 30% $H_2SO_4$ aqueous solution and desmutting treatment was performed at 55° C. for 2 minutes. Then, the cathode was arranged on the surface having been subjected to graining treatment in a 20% $H_2SO_4$ aqueous solution at 33° C., and the plate was anodized at electric current density of 5 $A/dm^2$ for 50 seconds. The anodic oxidation layer obtained had a thickness of 2.7 $g/m^2$. This plate was designated support 1.
Support 2

The following liquid composition 1 for undercoating for surface treatment was coated on support 1 so that the coating amount of P became about 0.05 $g/m^2$ and the support was dried at 100° C. for 1 minute. The thus-obtained support was designated support 2.

| Liquid composition 1 for undercoating | |
|---|---|
| Phenylphosphonic acid | 2 weight parts |
| Methanol | 800 weight parts |
| Water | 50 weight parts |

Support 3

The following liquid composition 2 for undercoating for surface treatment was coated on support 1 so that the coating amount of Si became about 0.001 $g/m^2$ and the support was dried at 100° C. for 1 minute. The thus-obtained support was designated support 3.
Liquid Composition 2 for Undercoating The following composition was mixed and stirred, heat generation was observed after about 5 minutes. After the reaction was continued for 60 minutes, the content was poured into different vessel, 30,000 weight parts of methanol was further added thereto, the thus obtained solution was designated liquid composition 2.

| | |
|---|---|
| Phosmer PE (manufactured by Uni Chemical Co. Ltd.) | 20 weight parts |
| Methanol | 130 weight parts |
| Water | 20 weight parts |
| Paratoluenesulfonic acid | 5 weight parts |
| Tetraethoxysilane | 50 weight parts |
| 3-Methacryloxypropyl triethoxysilane | 50 weight parts |

Photosensitive Material

Photopolymerizable composition shown below was coated on each of the above supports 1, 2 and 3 in a dry coating weight of 1.5 $g/m^2$, and the coated layer was dried at 100° C. for 1 minute, thereby a photosensitive layer was obtained.

A 3 wt % aqueous solution of polyvinyl alcohol (saponification degree: 98 mol %, polymerization degree: 500) was coated on the photosensitive layer in a dry coating weight of 2.5 $g/m^2$, and dried at 100° C. for 3 minutes. Thus, a photosensitive lithographic printing plate (photosensitive material) was obtained.
Coating Solution for Photosensitive Layer
(photopolymerizable composition, details are shown in Table 1 below).

| | |
|---|---|
| Compound (A) having ethylenically unsaturated bond | a weight parts |
| Linear organic high polymer (B) | b weight parts |
| Sensitizer (C) | 0.15 weight part |
| Photopolymerization initiator (D) | 0.30 weight part |
| Additive (S) | 0.50 weight part |
| Fluorine-containing surfactant (Megafac F-177, manufactured by Dai-Nippon Ink & Chemicals, Inc.) | 0.03 weight part |
| Thermal polymerization inhibitor (N-nitrosophenylhydroxylaznine aluminum salt) | 0.01 weight part |
| ε type copper phthalocyanine dispersion | 0.2 weight part |
| Methyl ethyl ketone | 30.0 weight parts |
| Propylene glycol monomethyl ether | 30.0 weight parts |

Compound (A) having ethylenically unsaturated bond, linear organic high polymer (B), sensitizer (C), photopolymerization initiator (D) and additive (S) for use in the coating solution for photosensitive layer are shown below.

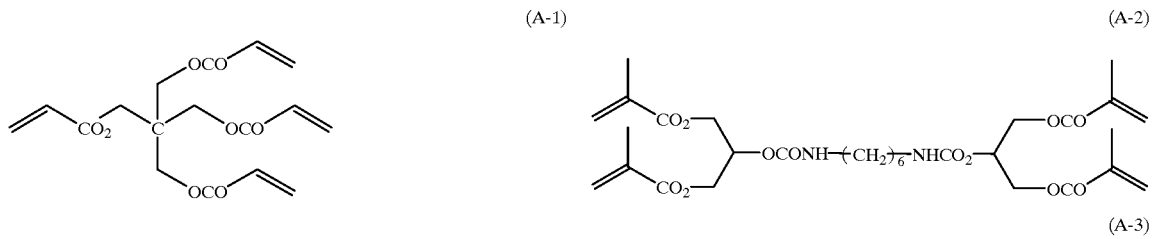
(A-1)
(A-2)
Mixture of
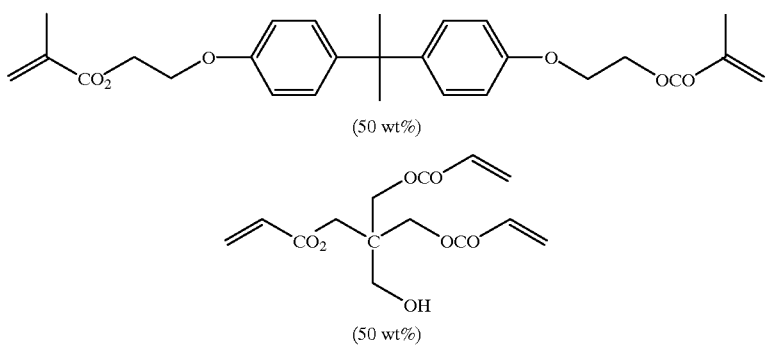
(A-3)
(50 wt%)
(50 wt%)
Mixture of
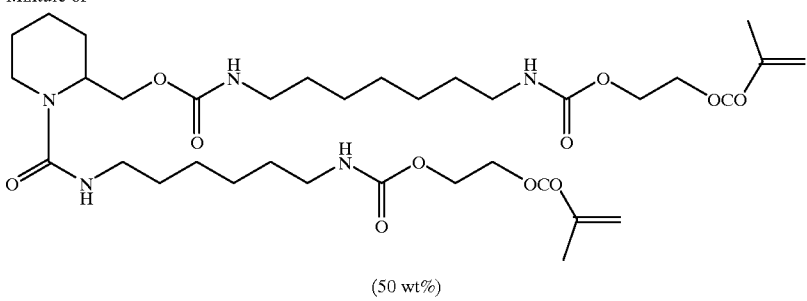
(A-4)
(50 wt%)
(50 wt%)
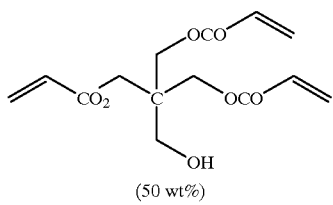
(B-1)
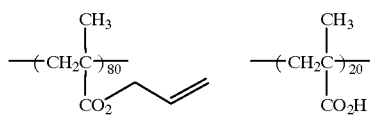
$\overline{M}w50000$
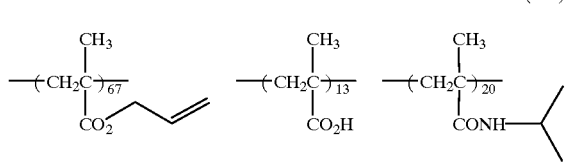
(B-2)
$\overline{M}w150000$
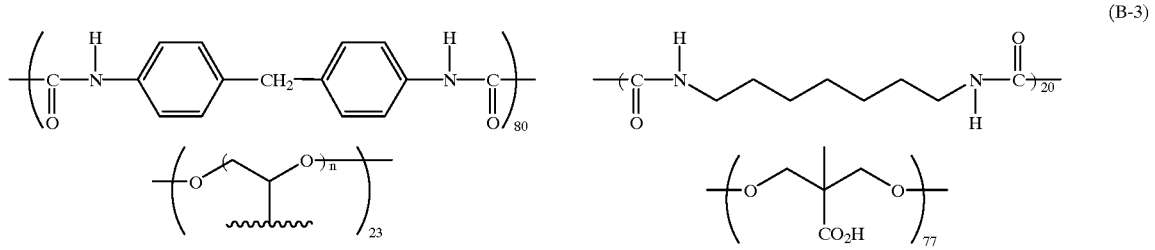
(B-3)
PPG1000
$\overline{M}w60000$ -continued
(C-1)
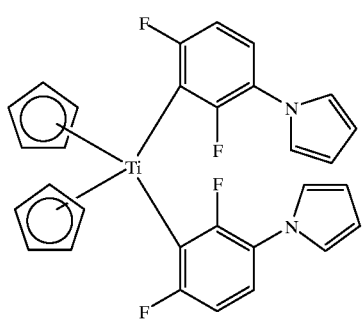
(C-2)
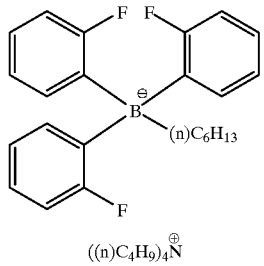
(C-3)
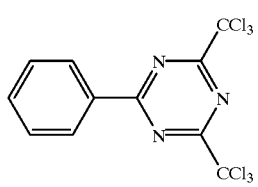
(C-4)
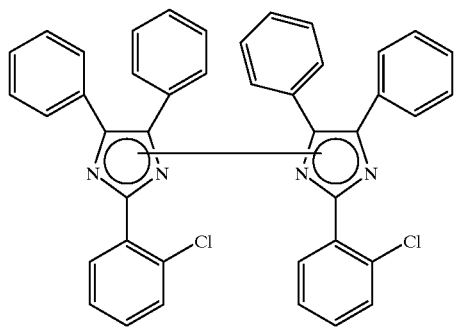
(D-1)
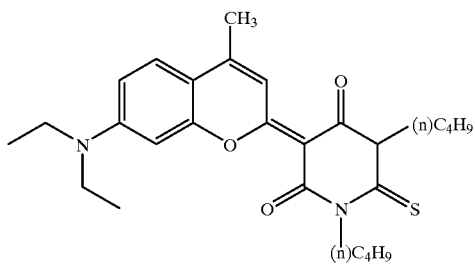
(D-2)
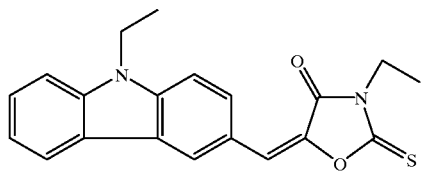
(D-3)
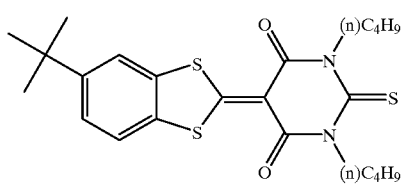
(D-4)
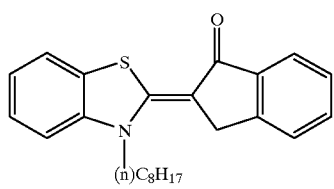
(S-1)
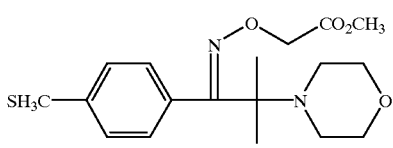
(S-2)
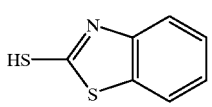
(S-3)
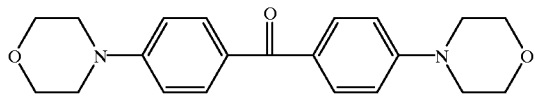

TABLE 1

(Photosensitive Material)

| No. of Material | A (a weight parts) | B (b weight parts) | C | D | S | Support | Photosensitive Layer Acid Value (meq/g) |
|---|---|---|---|---|---|---|---|
| 1 (Invention) | A-1 (1.7) | B-1 (1.9) | C-1 | D-1 | S-1 | 1 | 0.45 |
| 2 (Invention) | A-1 (1.7) | B-2 (1.9) | C-1 | D-1 | S-1 | 2 | 0.42 |
| 3 (Invention) | A-1 (1.5) | B-1 (2.0) | C-1 | D-1 | S-1 | 3 | 0.71 |
| 4 (Invention) | A-2 (2.3) | B-3 (2.0) | C-1 | D-1 | S-1 | 3 | 0.48 |
| 5 (Invention) | A-1 (1.7) | B-2 (1.9) | C-1 | D-2 | S-1 | 2 | 0.43 |
| 6 (Invention) | A-2 (1.7) | B-2 (1.9) | C-2 | D-3 | S-3 | 1 | 0.43 |
| 7 (Invention) | A-1 (1.7) | B-2 (1.9) | C-3 | D-4 | S-1 | 2 | 0.46 |
| 8 (Invention) | A-3 (1.7) | B-2 (1.9) | C-4 | D-4 | S-2 | 2 | 0.45 |
| 9 (Invention) | A-4 (1.7) | B-2 (1.9) | C-1 | D-1 | S-2 | 2 | 0.46 |

\* The photosensitive layer acid value was a measured value obtained by calculation from sodium hydroxide titration of the acid amount contained per g of the photosensitive layers.

Developing Solution

The developing solution having the following composition was prepared.

| Developing solutions 1 to 20 (Invention) (details are shown in Table 2 below). | |
|---|---|
| Alkali (X) | x g |
| Compound represented by formula (I) (Y) | 5.0 g |
| Chelating agent (Z) | 0.1 g |
| Additive 1 (P) | 1.0 g |
| Additive 2 (Q) | 1.0 g |
| Water | (92.9-x) g |
| Developing solutions 21 to 40 (Invention) (details are shown in Table 2-2 below). | |
| Alkali (X) | x g |
| Compound represented by formula (I) (Y) | 5.0 g |
| Chelating agent (Z) | 0.15 g |
| Water | (94.85-x) g |

Chelating agent (Z), additive 1 (P) and additive 2 (Q) for use in the developing solution are shown below.

Ethylenediaminetetraacetic acid·4Na salt (Z-1)

Citric acid (Z-2)

Hydroxyethyl ethylenediaminetriacetic acid· 3K salt (Z-3)

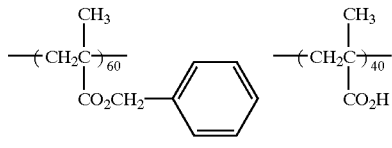
(P-1)

$(n)C_{15}H_{31}CO_2H$ (P-2)

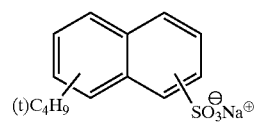
(P-3)

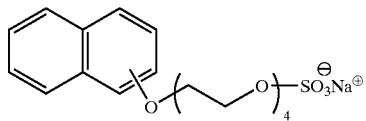
(P-4)

$(t)C_4H_9$—⟨phenyl⟩—$CO_2H$ (Q-1)

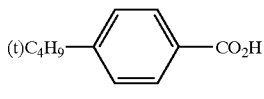
(Q-2)

(weight average molecular weight: 20,000)

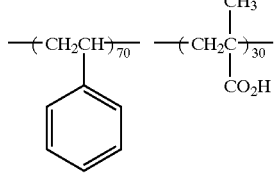
(Q-3)

(weight average molecular weight: 30,000)

TABLE 2

| No. of Developing Solution | X (x g) | Y | Z | P | Q |
|---|---|---|---|---|---|
| 1 (Invention) | NaOH (0.15) | Y-1 | Z-1 | None | None |
| 2 (Invention) | KOH (0.15) | Y-1 | Z-1 | None | None |
| 3 (Invention) | KOH (0.20) | Y-1 | Z-1 | P-1 | Q-1 |
| 4 (Invention) | KOH (0.15), Monoethanolamine (1.35) | Y-1 | Z-1 | None | None |

TABLE 2-continued

| No. of Developing Solution | X (x g) | Y | Z | P | Q |
|---|---|---|---|---|---|
| 5 (Invention) | KOH (0.15), Triethanolamine (1.35) | Y-1 | Z-1 | None | None |
| 6 (Invention) | KOH (0.15) | Y-1 | None | None | None |
| 7 (Invention) | KOH (0.15) | Y-4 | Z-1 | None | None |
| 8 (Invention) | KOH (0.15) | Y-6 | Z-1 | None | None |
| 9 (Invention) | KOH (0.15) | Y-7 | Z-1 | None | None |
| 10 (Invention) | KOH (0.15) | Y-10 | Z-1 | None | None |
| 11 (Invention) | KOH (0.15) | Y-13 | Z-1 | None | None |
| 12 (Invention) | KOH (0.15) | Y-17 | Z-1 | None | None |
| 13 (Invention) | KOH (0.15) | Y-21 | Z-1 | None | None |
| 14 (Invention) | KOH (0.15) | Y-1 | Z-2 | None | None |
| 15 (Invention) | KOH (0.15) | Y-1 | Z-3 | None | None |
| 16 (Invention) | KOH (0.15) | Y-1 | Z-1 | P-2 | None |
| 17 (Invention) | KOH (0.15) | Y-1 | Z-1 | P-3 | None |
| 18 (Invention) | KOH (0.15) | Y-1 | Z-1 | P-4 | None |
| 19 (Invention) | KOH (0.15) | Y-1 | Z-1 | P-2 | Q-2 |
| 20 (Invention) | KOH (0.15) | Y-1 | Z-1 | P-2 | Q-3 |
| 1 (Comp.) | KOH (0.15) | None | None | None | None |
| 2 (Comp.) | KOH (0.15) | None | Z-1 | None | None |
| 3 (Comp.) | KOH (2.0) | Y-1 | Z-1 | None | None |
| 4 | Silicate-based LP-D developing solution (manufactured by Fuji Photo Film Co., Ltd.) was diluted with water 10 times | | | | |
| 5 | Alkali-based DN-3C developing solution (manufactured by Fuji Photo Film Co., Ltd.) was diluted with water 5 times | | | | |

TABLE 2-2

| No. of Developing Solution | X (x g) | Y | Z |
|---|---|---|---|
| 21 (Invention) | NaOH (0.15), $Na_2CO_3$ (0.16) | Y-1 | Z-1 |
| 22 (Invention) | NaOH (0.06), $Na_2CO_3$ (0.16) | Y-1 | Z-1 |
| 23 (Invention) | KOH (0.15), $K_2CO_3$ (0.16) | Y-1 | Z-1 |
| 24 (Invention) | KOH (0.06), $KHCO_3$ (0.16) | Y-1 | Z-1 |
| 25 (Invention) | KOH (0.06), Dry ice (0.2) | Y-1 | Z-1 |
| 26 (Invention) | KOH (0.06), $K_2CO_3$ (0.16) | Y-1 | Z-1 |
| 27 (Invention) | KOH (0.06), $K_2CO_3$ (0.16) | Y-3 | Z-1 |
| 28 (Invention) | KOH (0.06), $K_2CO_3$ (0.16) | Y-4 | Z-1 |
| 29 (Invention) | KOH (0.06), $K_2CO_3$ (0.16) | Y-5 | Z-1 |
| 30 (Invention) | KOH (0.06), $K_2CO_3$ (0.16) | Y-3 | Z-2 |
| 31 (Invention) | KOH (0.06), $K_2CO_3$ (0.16) | Y-4 | Z-2 |
| 32 (Invention) | KOH (0.06), $K_2CO_3$ (0.16) | Y-6 | Z-2 |
| 33 (Invention) | KOH (0.06), $K_2CO_3$ (0.16) | Y-7 | Z-1 |
| 34 (Invention) | KOH (0.06), $K_2CO_3$ (0.16) | Y-9 | Z-2 |
| 35 (Invention) | KOH (0.06), $K_2CO_3$ (0.16) | Y-10 | Z-3 |
| 36 (Invention) | KOH (0.06), $K_2CO_3$ (0.16) | Y-13 | Z-1 |
| 37 (Invention) | KOH (0.06), $K_2CO_3$ (0.16) | Y-15 | Z-1 |
| 38 (Invention) | KOH (0.06), $K_2CO_3$ (0.16) | Y-17 | Z-1 |
| 39 (Invention) | KOH (0.06), $K_2CO_3$ (0.16) | Y-19 | Z-2 |
| 40 (Invention) | KOH (0.06), $K_2CO_3$ (0.16) | Y-21 | Z-3 |

Test of Properties of Developing Solution

Physical properties of each developing solution shown in Table 2 was examined according to the method described in the present specification and the results obtained are shown in Table 3 below.

TABLE 3

| No. of Developing Solution | pH | Electrical Conductance (mS/cm) |
|---|---|---|
| 2 (Invention) | 11.5 | 5 |
| 3 (Invention) | 12.3 | 8 |
| 5 (Invention) | 11.9 | 6 |
| 6 (Invention) | 11.8 | 4 |
| 7 (Invention) | 11.5 | 5 |
| 16 (Invention) | 11.8 | 6 |
| 1 (Comparison) | 11.6 | 5 |
| 2 (Comparison) | 11.5 | 5 |
| 3 (Comparison) | 12.8 | 25 |
| 4 | 12.8 | 32 |
| 5 | 10.0 | 7 |

Evaluation of Printing

The results obtained by combining the photosensitive materials shown in Table 1 and the developing solutions shown in Tables 2 and 2-2 are shown in Tables 4 and 4-2 below.

The exposure, printing and conditions of development are shown below.

Evaluation of Developing Properties

The above coated photosensitive material was subjected to development without exposure, and the color of the plate was visually evaluated. If there is a residual film, the color of the photosensitive layer remains.

Evaluation of Press Life and Resistance to Printing Staining

Each of the above coated photosensitive material was subjected to exposure of 100 $\mu J/cm^2$ (standard exposure condition) using FD-YAG lasers (manufactured by CSI Co., plate jet 4) of 532 nm, 100 mW, or Violet LD (internal drum type tester) of 405 nm, 30 mW on condition of 175 line/inch by 4,000 dip, and after scanning exposure of solid image and 1 to 99% dot image (every 1%), standard development was performed using an automatic processor (LP-850P2, manufactured by Fuji Photo Film Co., Ltd.) charged with various kinds of developing solutions and finishing gum solution FP-2W (manufactured by Fuji Photo Film Co., Ltd.), thus a lithographic printing plate was obtained. (Reached plate surface temperature by pre-heat after exposure was 100° C. and immersion time was 15 seconds.)

Printing was performed with the obtained printing plate by printing machine R201 (manufactured by Man Roland Co., Ltd.) using GEOS-G Japanese ink (N) (manufactured by Dai-Nippon Ink & Chemicals, Inc.) and press life was evaluated by the number of the sheets which caused dot-vanishing of 3% half dot. Printing was performed by Dia IF2 printing machine (manufactured by Mitsubishi Heavy Industry Co., Ltd.) using GEOS-G scarlet (S) (manufactured by Dai-Nippon Ink & Chemicals, Inc.). The non-image domain of the printed matter was visually observed and ink-staining was evaluated.

Evaluation of Development Scum

The above coated photosensitive material (20 m$^2$) was developed in the above developing solution (1 liter) and allowed to stand as it was for one month, and the presence of the precipitated development scum was examined. The results obtained are shown in Tables 4 and 4-2.

TABLE 4

(Results of Evaluation)

| Example No. | Photo-sensitive Material No. | Developing Solution No. | Developing Properties (residual film) | Press Life | Printing Staining | Generation of Development Scum |
|---|---|---|---|---|---|---|
| 1 (Invention) | 1 | 1 | Absent | 200,000 | None | None |
| 2 (Invention) | 2 | 2 | Absent | 200,000 | None | None |
| 3 (Invention) | 3 | 2 | Absent | 120,000 | None | None |
| 4 (Invention) | 4 | 2 | Absent | 250,000 | None | None |
| 5 (Invention) | 5 | 2 | Absent | 200,000 | None | None |
| 6 (Invention) | 6 | 2 | Absent | 200,000 | None | None |
| 7 (Invention) | 7 | 2 | Absent | 200,000 | None | None |
| 8 (Invention) | 8 | 2 | Absent | 150,000 | None | None |
| 9 (Invention) | 9 | 2 | Absent | 150,000 | None | None |
| 10 (Invention) | 2 | 1 | Absent | 200,000 | None | None |
| 11 (Invention) | 2 | 3 | Absent | 200,000 | None | None |
| 12 (Invention) | 2 | 4 | Absent | 200,000 | None | None |
| 13 (Invention) | 2 | 5 | Absent | 150,000 | None | None |
| 14 (Invention) | 2 | 6 | Absent | 200,000 | None | None |
| 15 (Invention) | 2 | 7 | Absent | 200,000 | None | None |
| 16 (Invention) | 2 | 8 | Absent | 200,000 | None | None |
| 17 (Invention) | 2 | 9 | Absent | 150,000 | None | None |
| 18 (Invention) | 2 | 10 | Absent | 150,000 | None | None |
| 19 (Invention) | 2 | 11 | Absent | 200,000 | None | None |
| 20 (Invention) | 2 | 12 | Absent | 150,000 | None | None |
| 21 (Invention) | 2 | 13 | Absent | 150,000 | None | None |

TABLE 4-continued (Results of Evaluation)

| Example No. | Photo-sensitive Material No. | Developing Solution No. | Developing Properties (residual film) | Press Life | Printing Staining | Generation of Development Scum |
|---|---|---|---|---|---|---|
| 22 (Invention) | 2 | 14 | Absent | 150,000 | None | None |
| 23 (Invention) | 2 | 15 | Absent | 200,000 | None | None |
| 24 (Invention) | 2 | 16 | Absent | 150,000 | None | None |
| 25 (Invention) | 2 | 17 | Absent | 150,000 | None | None |
| 26 (Invention) | 2 | 18 | Absent | 150,000 | None | None |
| 27 (Invention) | 2 | 19 | Absent | 150,000 | None | None |
| 28 (Invention) | 2 | 20 | Absent | 150,000 | None | None |
| 1 (Comparison) | 2 | Comp. 1 | Present | 150,000 | Stained | Precipitated |
| 2 (Comparison) | 2 | Comp. 2 | Present | 150,000 | Stained | Precipitated |
| 3 (Comparison) | 2 | Comp. 3 | Absent | 10,000 | Stained | Precipitated |
| 4 (Comparison) | 2 | Comp. 4 | Absent | 100,000 | None | Precipitated |
| 5 (Comparison) | 2 | Comp. 5 | Absent | 50,000 | Stained | Precipitated |

TABLE 4-2

(Results of Evaluation)

| Example No. | Photo-sensitive Material No. | Developing Solution No. | Developing Properties (residual film) | Press Life | Printing Staining | Generation of Development Scum |
|---|---|---|---|---|---|---|
| 29 (Invention) | 1 | 26 | Absent | 200,000 | None | None |
| 30 (Invention) | 2 | 26 | Absent | 200,000 | None | None |
| 31 (Invention) | 3 | 26 | Absent | 120,000 | None | None |
| 32 (Invention) | 4 | 26 | Absent | 250,000 | None | None |
| 33 (Invention) | 5 | 26 | Absent | 200,000 | None | None |
| 34 (Invention) | 6 | 26 | Absent | 200,000 | None | None |
| 35 (Invention) | 7 | 26 | Absent | 200,000 | None | None |
| 36 (Invention) | 8 | 26 | Absent | 150,000 | None | None |
| 37 (Invention) | 9 | 26 | Absent | 150,000 | None | None |
| 38 (Invention) | 2 | 21 | Absent | 200,000 | None | None |
| 39 (Invention) | 2 | 22 | Absent | 200,000 | None | None |
| 40 (Invention) | 2 | 23 | Absent | 200,000 | None | None |
| 41 (Invention) | 2 | 24 | Absent | 200,000 | None | None |
| 42 (Invention) | 2 | 25 | Absent | 200,000 | None | None |

TABLE 4-2-continued (Results of Evaluation)

| Example No. | Photo-sensitive Material No. | Developing Solution | Developing Properties (residual film) | Press Life | Printing Staining | Generation of Development Scum |
|---|---|---|---|---|---|---|
| 43 (Invention) | 2 | 27 | Absent | 200,000 | None | None |
| 44 (Invention) | 2 | 28 | Absent | 200,000 | None | None |
| 45 (Invention) | 2 | 29 | Absent | 200,000 | None | None |
| 46 (Invention) | 2 | 30 | Absent | 200,000 | None | None |
| 47 (Invention) | 2 | 31 | Absent | 150,000 | None | None |
| 48 (Invention) | 2 | 32 | Absent | 200,000 | None | None |
| 49 (Invention) | 2 | 33 | Absent | 150,000 | None | None |
| 50 (Invention) | 2 | 34 | Absent | 150,000 | None | None |
| 51 (Invention) | 2 | 35 | Absent | 200,000 | None | None |
| 52 (Invention) | 2 | 36 | Absent | 200,000 | None | None |
| 53 (Invention) | 2 | 37 | Absent | 150,000 | None | None |
| 54 (Invention) | 2 | 38 | Absent | 200,000 | None | None |
| 55 (Invention) | 2 | 39 | Absent | 200,000 | None | None |
| 56 (Invention) | 2 | 40 | Absent | 150,000 | None | None |

* Photosensitive Materials 5 to 8 were exposed with 405 nm, Materials 1 to 4 and 9 were exposed with 532 nm.

As is apparent from the results in Tables 4 and 4-2, the developing solutions according to the present invention show good developing properties, i.e., press life and resistance to printing staining can be compatible, do not generate development scum and are excellent in processing stability.

Examination of Development Behavior

Development behavior of the photosensitive material shown in Table 4 was examined according to the method described in the present specification and the results obtained are shown in Table 5 below.

TABLE 5

| Example No. | Photo-sensitive Material | Developing Solution | Developing Speed in Unexposed Domain ($\mu$m/s) | Osmotic Speed of Developing Solution in Exposed Domain ($\mu$m/s) | Dissolution Behavior (Presence or Absence of coherent wave) |
|---|---|---|---|---|---|
| Example 2 | 2 | 2 | 0.2 | 0.005 | Present |
| Comparative Example 1 | 2 | Comparison 1 | 0.005 | 0.005 | Absent |
| Comparative Example 2 | 2 | Comparison 2 | 0.005 | 0.005 | Absent |
| Comparative Example 3 | 2 | Comparison 3 | 0.01 | 0.15 | Absent |
| Comparative Example 4 | 2 | Comparison 4 | 0.01 | 0.15 | Absent |
| Comparative Example 5 | 2 | Comparison 5 | 0.05 | 0.2 | Absent |

EFFECT OF THE INVENTION

According to the developing solution for a photosensitive lithographic printing plate, plate-making method and a photosensitive lithographic printing plate of the present invention, printing staining resistance and press life can be compatible without impairing image-forming properties, the compound insolubly in a developing solution can be dissolved or dispersed stable for a long period of time, and further, processing stability can be improved.

EXAMPLE (1)

A 1S aluminum plate having a thickness of 0.30 mm was subjected to brush-graining treatment using a No. 8 nylon brush and a suspension of 800 mesh pumice and water, and the surface of the plate was thoroughly washed with water. The etching was effected by immersing the plate in a 10% sodium hydroxide aqueous solution at 70° C. for 60 seconds, the plate was further washed with flowing water, then washed with a 20% $HNO_3$ aqueous solution for neutralization followed by washing with water. Under the condition of $V_A$ of 12.7 V using alternating waveform electric current of sine wave, the plate was subjected to electrolytic surface roughening treatment in a 1% nitric acid aqueous solution by the quantity of electricity of 300 C/dm$^2$ at anode. The surface roughness determined was 0.45 $\mu$m (Ra). Subsequently, the plate was immersed in a 30% $H_2SO_4$ aqueous solution and desmutting treatment was performed at 55° C. for 2 minutes. Then, the cathode was arranged on the surface having been subjected to graining treatment in a 20% $H_2SO_4$ aqueous solution at 33° C., and the plate was anodized at electric current density of 5 A/dm$^2$ for 50 seconds. The anodic oxidation layer obtained had a thickness of 2.7 g/m$^2$.

Photopolymerizable composition shown below was coated on the thus-processed aluminum plate in a dry coating weight of 1.5 g/m$^2$, and the coated layer was dried at 100° C. for 1 minute, thereby a photosensitive layer was obtained.

| Coating solution for photosensitive layer | |
|---|---|
| Compound (A1) having ethylenically unsaturated bond | 1.5 weight parts |
| Linear organic high polymer (B1) | 2.0 weight parts |
| Sensitizer (C1) | 0.15 weight part |
| Photopolymerization initiator (D1) | 0.2 weight part |
| ε-Phthalocyanine dispersion (F1) | 0.02 weight part |
| Fluorine-containing surfactant (Megafac F-177, manufactured by Dai-Nippon Ink & Chemicals, Inc.) | 0.03 weight part |
| Methyl ethyl ketone | 9.0 weight parts |
| Propylene glycol monomethyl ether acetate | 7.5 weight parts |
| Toluene | 11.0 weight parts |

A1

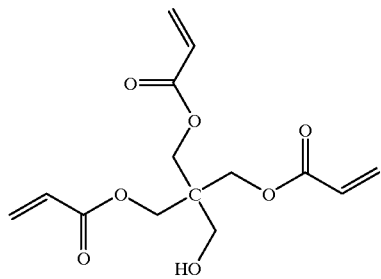

B1

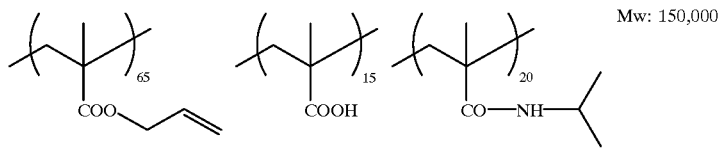

C1

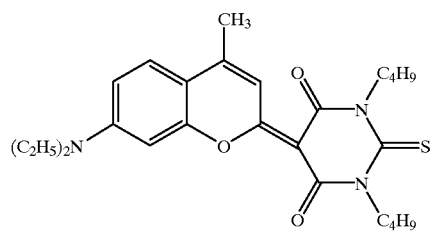

D1

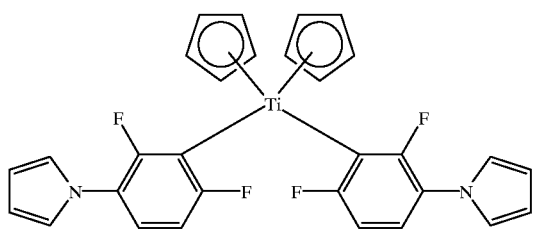

F1

| Coating solution for photosensitive layer |
|---|
| 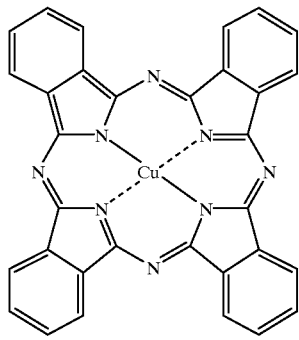 |

A 3 wt % aqueous solution of polyvinyl alcohol (saponification degree: 98 mol %, polymerization degree: 500) was coated on the photosensitive layer in a dry coating weight of 2.5 g/m², and dried at 100° C. for 3 minutes. Thus, a photosensitive lithographic printing plate was obtained.

The above coated photosensitive material was subjected to exposure of 100 μJ/cm² using FD-YAG lasers (manufactured by CSI Co., plate jet 4) on condition of 175 line/inch by 4,000 dip, and after scanning exposure of solid image and 1 to 99% dot image (every 1%), standard development was performed using an automatic processor (LP-850P2, manufactured by Fuji Photo Film Co., Ltd.) charged with developing solution 1 and finishing gum solution FP-2W (manufactured by Fuji Photo Film Co., Ltd.).

The conditions of pre-heat were such that the plate surface temperature reached by pre-heat was 100° C., the temperature of the developing solution was 30° C. and immersion time was about 15 seconds.

Developing solution 1 had the following composition, pH at 25° C. was 11.5, and electrical conductance was 5 mS/cm.

| Composition of developing solution 1 | |
|---|---|
| Potassium hydroxide | 0.15 g |
| Polyoxyethylene phenyl ether (n = 3) | 5.0 g |
| Chilest 400 (a chelating agent) | 0.1 g |
| Water | 94.75 g |

EXAMPLES (2) to (5)

Each lithographic printing plate was prepared in the same manner as in Example (1) except that the developing solution in Example (1) was changed to the developing solution shown in Table (1).

TABLE 1

| Example (2) | | Example (3) | | Example (4) | | Example (5) | |
|---|---|---|---|---|---|---|---|
| Potassium hydroxide: | 0.15 g | Potassium hydroxide: | 0.15 g | Potassium hydroxide: | 0.15 g | Potassium hydroxide: | 0.2 g |
| Polyoxyethylene methylphenyl ether (n = 10): | 5.0 g | Polyoxyethylene naphthyl ether (n = 10:) | 5.0 g | Triethanolamine | 1.35 g | Polyoxyethylene naphthyl ether (n = 10): | 5.0 g |
| Chilest 400; | 0.1 g | Chilest 400; | 0.1 g | Polyoxyethylene phenyl ether (n = 12): | 5.0 g | Anon LG: | 1.0 g |
| Water: | 94.75 g | Water: | 94.75 g | Chilest 400; | 0.1 g | Chilest 400; | 0.1 g |
| pH | 11.8 | PH | 11.7 | Water: | 93.4 g | p-t-Butylbenzoic acid: | 1 g |
| electrical conductance: | 5 mS/cm | electrical conductance: | 5 mS/cm | pH | 11.9 | Water: | 92.3 g |
|  |  |  |  | electrical conductance: | 5 mS/cm | pH | 12.3 g |
|  |  |  |  |  |  | electrical conductance: | 5 mS/cm |

A lithographic printing plate was in the same manner as in Example (1) except that linear organic high polymer B1 in photopolymerizable composition 1 in Example (1) was changed to the following B2 (Example (6)), and from polymer B1 to the following B3 (Example (7)).

EXAMPLE (6)

Allyl methacrylate/methacrylic acid (70/30 mol %) copolymer, molecular weight: 50,000

EXAMPLE (7)

Methyl methacrylate/isobutanol methacrylate/methacrylic acid (60/20/20 mol %) copolymer, molecular weight: 100,000

EXAMPLE (8)

A lithographic printing plate was in the same manner as in Example (1) except that ethylenically unsaturated compound A1 in photopolymerizable composition 1 in Example (1) was changed to the following A2.

A2

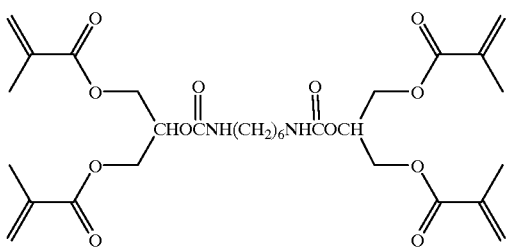

EXAMPLE (9)

The following composition was mixed and stirred, heat generation was observed after about 5 minutes. After the reaction was continued for 60 minutes, the content was poured into different vessel, 30,000 weight parts of methanol was further added thereto, thus a coating solution was obtained.

| Liquid composition for undercoating | |
| --- | --- |
| Phosmer PE (manufactured by Uni Chemical Co. Ltd.) | 20 weight parts |
| Methanol | 130 weight parts |
| Water | 20 weight parts |
| Paratoluenesulfonic acid | 5 weight parts |
| Tetraethoxysilane | 50 weight parts |
| 3-Methacryloxypropyl triethoxysilane | 50 weight parts |

The coating solution was coated on the anodized aluminum support in Example (1) so that the coating amount of Si became about 0.001 g/m$^2$ and the support was dried at 100° C. for 1 minute.

A photosensitive layer and a water-soluble resin layer were provided on the same manner as in Example (1) and the prepared photosensitive material was subjected to exposure and development, thus a lithographic printing plate was prepared.

Comparative Example (1)

A lithographic printing plate was prepared in the same manner as in Example (1) except that the composition obtained by removing polyoxyethylene phenyl ether from the developing solution 1 in Example (1) was used as the developing solution (pH 11.5, electrical conductance 5 mS/cm).

Comparative Example (2)

A lithographic printing plate was prepared in the same manner as in Example (1) except that the addition amount of potassium hydroxide in developing solution 1 was changed to 2 g (pH 12.8, electrical conductance 25 mS/cm).

Comparative Example (3)

A lithographic printing plate was prepared in the same manner as in Example (1) except that LP-D (manufactured by Fuji Photo Film Co., Ltd.) diluted 10 times was used as a developing solution containing alkali metal silicate in place of developing solution 1 (pH 12.8, electrical conductance 32 mS/cm).

Developing properties, press life and printing staining of the lithographic printing plates obtained in Examples (1) to (9) and Comparative Examples (1) to (3) were evaluated. The plate surface of the printing plate after development process was visually observed and the developing properties was evaluated from the presence or absence of residual film and the degree of residual film. Printing was performed with the obtained printing plate by printing machine R201 (manufactured by Man Roland Co., Ltd.) using GEOS-G Japanese ink (N) (manufactured by Dai-Nippon Ink & Chemicals, Inc.) and press life was evaluated by the number of the sheets which caused dot-vanishing of 3% half dot. Printing was performed by Dia IF2 printing machine (manufactured by Mitsubishi Heavy Industry Co., Ltd.) using GEOS-G scarlet (S) (manufactured by Dai-Nippon Ink & Chemicals, Inc.). The non-image domain of the printed matter was visually observed and staining was evaluated. The results obtained are shown in Table (2).

TABLE 2

(Results of Evaluation of Printing Plate)

| Example No. | Developing Properties (residual film) | Press Life | Printing Staining |
| --- | --- | --- | --- |
| Example (1) | None | 150,000 | None |
| Example (2) | None | 150,000 | None |
| Example (3) | None | 150,000 | None |
| Example (4) | None | 150,000 | None |
| Example (5) | None | 120,000 | None |
| Example (6) | None | 150,000 | None |
| Example (7) | None | 100,000 | None |
| Example (8) | None | 150,000 | None |
| Example (9) | None | 180,000 | None |
| Comparative Example (1) | Slightly present | 150,000 | Extremely stained |
| Comparative Example (2) | Slightly present | 10,000 | Slightly stained |
| Comparative Example (3) | None | 5,000 | None |

As is apparent from the results in Table (2), the lithographic printing plates according to the present invention showed satisfactory results but comparative samples were unsatisfactory at least in any item.

Effect of the Invention

As has been described, a lithographic printing plate excellent in developing properties, causing no printing staining and excellent in press life can be obtained according to the plate-making method of the present invention using a photosensitive lithographic printing plate having a photosensitive layer comprising photopolymerizable composition and a developing solution having relatively low pH and containing a nonionic surfactant having special structure. Further, since the developing solution according to the present invention is low in pH, the influence of waste solution on environment can also be improved.

While the invention has been described in detail and with reference to specific examples thereof, it will be apparent to one skilled in the art that various changes and modifications can be made therein without departing from the spirit and scope thereof.

What is claimed is:

1. A plate-making method of a lithographic printing plate which comprises the steps of exposure of a photo-sensitive lithographic printing plate comprising a support having an anodized film on the surface having provided thereon a photopolymerizable photosensitive layer containing a compound having an addition polymerizable ethylenically unsaturated double bond, a high polymer soluble or swelling in an alkali aqueous solution, and a photopolymerization initiator with a laser beam, and then development with a developing solution comprising an alkali aqueous solution containing 2 to 10 wt % of at least one of a nonionic aromatic ether-based activator represented by the following formula (I-A) and a nonionic aromatic ether-based activator represented by the following formula (I-B):

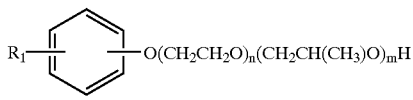
(I-A)

wherein $R_1$ represents H or an alkyl group having from 1 to 100 carbon atoms, and n represents an integer of from 0 to 100 and m represents an integer of from 0 to 100 and the sum of n+m is at least 3,

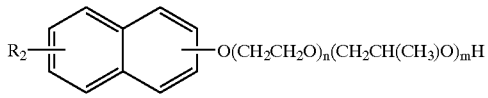
(I-B)

wherein $R_2$ represents H or an alkyl group having from 1 to 100 carbon atoms, and n and m each represents an integer of from 0 to 100.

2. The plate-making method of a lithographic printing plate as claimed in claim 1, wherein the developing solution contains an inorganic alkali agent.

3. The plate-making method of a lithographic printing plate as claimed in claim 1, wherein the developing solution has a pH of 13.0 or less.

4. The plate-making method of a lithographic printing plate as claimed in claim 1, wherein the developing solution contains a carbonic acid or a carbonate.

5. The plate-making method of a lithographic printing plate as claimed in claim 1, wherein the developing solution contains a chelating agent containing a divalent metal.

6. The plate-making method of a lithographic printing plate as claimed in claim 1, wherein the developing solution has an electrical conductance of from 3 to 30 S/cm.

7. The plate-making method of a lithographic printing plate as claimed in claim 1, wherein the developing solution is a non-silicate system.

8. The plate-making method of a lithographic printing plate as claimed in claim 1, wherein the development is carried out at a developing speed in an unexposed domain of 0.05 µm/s or more and at an osmotic speed of the developing solution in an exposed domain of 0.1 µm/s or less.

9. The plate-making method of a lithographic printing plate as claimed in claim 1, wherein the development is carried out so as to dissolve the photosensitive layer in order from the surface without swelling and peeling of the photosensitive layer.

10. The plate-making method of a lithographic printing plate as claimed in claim 1, wherein the alkali aqueous solution contains 2 to 10 wt % of the nonionic aromatic ether-based activator represented by formula (I-B).

* * * * *